(12) United States Patent
Hamaguchi et al.

(10) Patent No.: US 9,595,810 B2
(45) Date of Patent: Mar. 14, 2017

(54) LIGHT EMITTING ELEMENT HAVING MULTIPLE SURFACE AREAS OF A SEMICONDUCTOR LAYER AND METHOD OF PRODUCING SAME

(71) Applicant: Sony Corporation, Tokyo (JP)

(72) Inventors: Tatsushi Hamaguchi, Kanagawa (JP); Masaru Kuramoto, Kanagawa (JP); Noriyuki Futagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/449,888

(22) Filed: Aug. 1, 2014

(65) Prior Publication Data

US 2015/0043606 A1 Feb. 12, 2015

(30) Foreign Application Priority Data

Aug. 9, 2013 (JP) ................. 2013-166570

(51) Int. Cl.

| | |
|---|---|
| *H01L 21/00* | (2006.01) |
| *H01S 5/183* | (2006.01) |
| *H01S 5/042* | (2006.01) |
| *H01S 5/187* | (2006.01) |
| *H01S 5/343* | (2006.01) |
| *H01S 5/02* | (2006.01) |

(52) U.S. Cl.
CPC ............ *H01S 5/183* (2013.01); *H01S 5/0425* (2013.01); *H01S 5/187* (2013.01); *H01S 5/18361* (2013.01); *H01S 5/18388* (2013.01); *H01S 5/18391* (2013.01); *H01S 5/34333* (2013.01); *H01S 5/0216* (2013.01); *H01S 5/0217* (2013.01); *H01S 5/18311* (2013.01); *H01S 5/18341* (2013.01); *H01S 5/18369* (2013.01); *H01S 2304/12* (2013.01)

(58) Field of Classification Search
CPC . H01L 33/05; H01L 33/60; H01L 2924/0002; H01L 2924/00; H01L 33/0079; H01L 33/405; H01L 33/42; H01S 5/18327
USPC .............................................. 257/79; 438/29
See application file for complete search history.

(56) References Cited

U.S. PATENT DOCUMENTS

| | | | |
|---|---|---|---|
| 5,038,356 A * | 8/1991 | Botez .................. | H01S 5/18369 257/15 |
| 2006/0202219 A1* | 9/2006 | Ohashi ................... | H01L 33/20 257/98 |
| 2010/0213493 A1* | 8/2010 | Hsu ........................ | H01L 33/22 257/98 |

(Continued)

*Primary Examiner* — Duy T Nguyen
(74) *Attorney, Agent, or Firm* — Sheridan Ross P.C.

(57) ABSTRACT

Light emitting elements, and methods of producing the same, the light emitting elements including: a laminated structure, the laminated structure including a first compound semiconductor layer that includes a first surface and a second surface facing the first surface, an active layer that is in contact with the second surface of the first compound semiconductor layer, and a second compound semiconductor layer; where the first surface of the first compound semiconductor layer has a first surface area and a second surface area, the first and second surface areas being different in at least one of a height or a roughness, a first light reflection layer is formed on at least a portion of the first surface area, and a first electrode is formed on at least a portion of the second surface area.

17 Claims, 16 Drawing Sheets

(56) References Cited

U.S. PATENT DOCUMENTS

| | | | |
|---|---|---|---|
| 2010/0230713 A1* | 9/2010 | Minemoto | C30B 19/02 257/103 |
| 2011/0024789 A1* | 2/2011 | Yao et al. | 257/99 |
| 2012/0037945 A1* | 2/2012 | Kim | H01L 33/405 257/98 |
| 2012/0322189 A1* | 12/2012 | Nakada et al. | 438/46 |
| 2013/0010822 A1* | 1/2013 | Suzuki et al. | 372/44.01 |

* cited by examiner

LIGHT EMITTING ELEMENT HAVING MULTIPLE SURFACE AREAS OF A SEMICONDUCTOR LAYER AND METHOD OF PRODUCING SAME

CROSS REFERENCE TO RELATED APPLICATIONS

This application claims the benefit of Japanese Priority Patent Application JP 2013-166570 filed Aug. 9, 2013, the entire contents of which are incorporated herein by reference.

BACKGROUND

The present disclosure relates to a light emitting element and a method of producing the same.

In the related art, for example, Japanese Unexamined Patent Application Publication No. 2010-123921, there is disclosed a surface light emitting laser element (vertical resonator laser, VCSEL) formed of a nitride semiconductor. The surface light emitting laser element disclosed herein is produced by forming a laminate of a nitride semiconductor laminated by a second conductive layer, a light-emitting layer, and a first conductive layer in this order on a substrate, forming a first bragg reflector formed of a dielectric multilayer film on the first conductive layer, forming a first electrode electrically connected with the first conductive layer on the first bragg reflector, bonding the laminate to a support substrate via the first bragg reflector and the first electrode, eliminating the substrate from the laminate to exposes a second conductive layer, and forming a second bragg reflector which is formed of a second electrode and the dielectric multilayer film and arranged so as to face the first bragg reflector on the exposed surface of the second conductive layer.

Here, the second conductive layer is exposed by eliminating a part of or the entirety of the substrate from the laminate, and a laser lift-off method, polishing, or etching is used for this elimination of the substrate. In addition, light scattering on the surface of the second conductive layer is minimized by carrying out a mirror finish of the surface of the exposed second conductive layer based on a CMP method (chemical/mechanical polishing method) using an appropriate polishing agent or an etching method using an appropriate etchant. Further, the second electrode and the second bragg reflector are formed on the surface of the mirror-finished second electrode layer in an arbitrary order.

SUMMARY

However, there is a problem in that the contact resistance between a second conductive layer and a second electrode is likely to be increased when the second electrode is formed on the surface of the mirror-finished second conductive layer.

It is desirable to provide, in various illustrative embodiments, light emitting elements, including: a laminated structure, the laminated structure including a first compound semiconductor layer that includes a first surface and a second surface facing the first surface, an active layer that is in contact with the second surface of the first compound semiconductor layer, and a second compound semiconductor layer; where the first surface of the first compound semiconductor layer has a first surface area and a second surface area, the first and second surface areas being different in at least one of a height or a roughness, a first light reflection layer is formed on at least a portion of the first surface area, and a first electrode is formed on at least a portion of the second surface area.

It is also desirable to provide, in further illustrative embodiments, methods of producing a light emitting element, including: forming a laminated structure, the laminated structure including a first compound semiconductor layer that includes a first surface and a second surface facing the first surface, an active layer that is in contact with the second surface of the first compound semiconductor layer, and a second compound semiconductor layer; and forming a second surface area on the first surface of the first compound semiconductor layer, forming a first light reflection layer on at least a portion of a first surface area that is a portion of the first surface of the first compound semiconductor layer, the first and second surface areas being different in at least one of a height or a roughness, and forming a first electrode on at least a portion of the second surface area.

In addition, the effects described in the present application are merely examples and are not limited thereto, and there may be additional effects.

DETAILED DESCRIPTION OF EMBODIMENTS

Figure 1A:
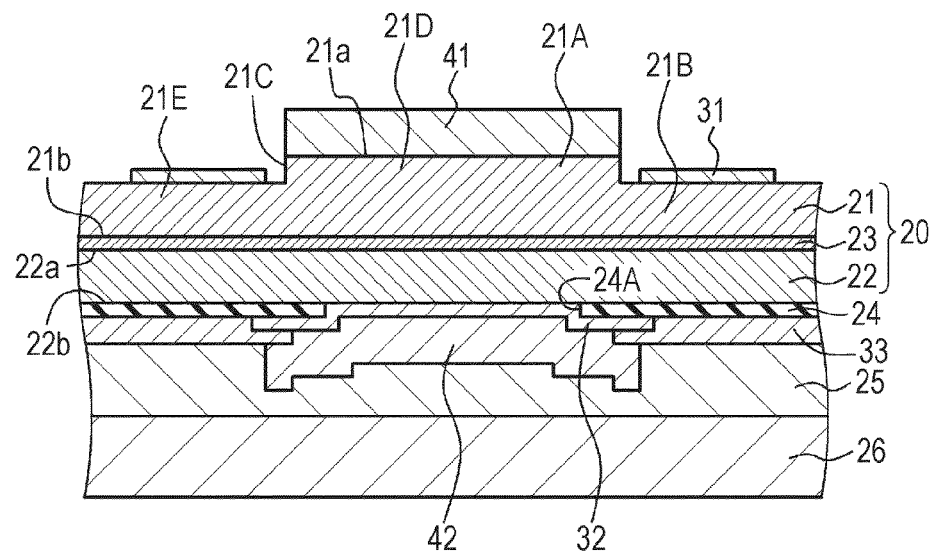
FIGS. 1A and 1B are respectively partial end views schematically illustrating a light emitting element of Example 1 and a modification example thereof.

Hereinafter, the present disclosure will be described based on Examples with reference to the accompanying drawings, but are not limited thereto, and various numerical values and materials in Examples are merely examples. In addition, description will be made in the following order.

1. Overall description related to a light emitting element according to a first embodiment and a second embodiment of the present disclosure and a method of producing a light emitting element according to the first embodiment and the second embodiment of the present disclosure
2. Example 1 (the light emitting element according to the first embodiment and the second embodiment of the present disclosure and the method of producing the light emitting element according to the first embodiment and the second embodiment of the present disclosure)
3. Example 2 (modification of Example 1) and the like Overall description related to a light emitting element according to a first embodiment and a second embodiment of the present disclosure and a method of producing a light emitting element according to the first embodiment and the second embodiment of the present disclosure In the method of producing the light emitting element according to the first embodiment of the present disclosure, the first surface of the first compound semiconductor layer in the process (d) is exposed (that is, elimination of a substrate for producing the light emitting element) based on a chemical/mechanical polishing method (CMP method), and a rough surface area in the process (e) is formed based on a reactive ion etching method (RIE method). Further, in the method of producing the light emitting element according to the second embodiment of the present disclosure, the first surface of the first compound semiconductor layer in the process (d) is exposed (that is, elimination of the substrate for producing the light emitting element) based on the chemical/mechanical polishing method, and a step portion in the process (e) is formed based on a reactive ion etching method. In addition, first, the first surface of the first compound semiconductor layer is exposed by eliminating the substrate for producing the light emitting element with a wet etching method using an alkali aqueous solution such as a sodium hydroxide aqueous solution or a potassium hydroxide aqueous solution, an ammonia solution+a hydrogen peroxide solution, a sulfuric acid solution+a hydrogen peroxide solution, a hydrochloric acid solution+a hydrogen peroxide solution, or a phosphorus acid solution+a hydrogen peroxide solution; a dry etching method; a lift-off method using laser; a mechanical polishing method; or a combination of these, or making the thickness of the substrate for producing the light emitting element thin, and carrying out the chemical/mechanical polishing method. A reactive ion beam etching (RIBE) method, an electron cyclotron resonance (ECR) etching method, or an ion beam etching method can be used instead of the reactive ion etching method. Examples of gas for etching include fluorine-based gas such as $CF_4$, chlorine-based gas such as $Cl_2$, $CCl_4$, or $SiCl_4$, and iodine-based gas such as HI, and the gas for etching may be used alone or by mixing these. The exposure treatment of the first surface of the first compound semiconductor layer includes a treatment of partially eliminating the exposed first compound semiconductor layer in the thickness direction and a mirror finish treatment with respect to the first surface of the first compound semiconductor layer. The length of a resonator which includes a first light reflection layer, a laminated structure, and a second light reflection layer arranged so as to face the first light reflection layer is determined by the exposure treatment of the first surface of the first compound semiconductor layer.

The light emitting element according to the first embodiment of the present disclosure or the light emitting element produced by the method of producing the light emitting element according to the first embodiment of the present disclosure including the above-described preferred modes is also referred to as "the light emitting element or the like according to the first embodiment of the present disclosure" hereinafter for convenience of description. In addition, the light emitting element according to the second embodiment of the present disclosure or the light emitting element produced by the method of producing the light emitting element according to the second embodiment of the present disclosure including the above-described preferred modes is also referred to as "the light emitting element or the like according to the second embodiment of the present disclosure" hereinafter for convenience of description.

In the light emitting element according to the first embodiment of the present disclosure, the rough surface area may surround the flat area.

In the light emitting element or the like according to the first embodiment of the present disclosure including the above-described preferred modes, the value of the surface roughness Ra of the flat area is $3 \times 10^{-9}$ m or less and it is preferable that the value of the surface roughness Ra of the rough surface area exceed the value of the surface roughness Ra of the flat area. In addition, the surface roughness Ra is prescribed in JIS B-610: 2001. Specifically, the surface roughness Ra of the flat area and the rough surface area can be measured by observation based on AFM or cross section TEM.

In addition, in the light emitting element according to the first embodiment of the present disclosure including the above-described various preferred modes, when the contact resistance value in the flat area is set as $R_1$ and the contact resistance value in the rough surface area is set as $R_2$, a relationship of $R_2/R_1 \leq 1$ is satisfied.

In the light emitting element or the like according to the second embodiment of the present disclosure, the step portion may be formed of a simple closed curve. Further, the simple closed curves (also referred to as Jordan closed curve) include a curve, a combination of segments, and a combination of a curve and a segment.

Moreover, in the light emitting element or the like according to the second embodiment of the present disclosure including the above-described preferred modes, the first light reflection layer may be formed on a convex portion of the first surface of the first compound semiconductor layer and the first electrode may be formed on a concave portion of the first surface of the first compound semiconductor layer. In contrast, the first light reflection layer may be formed on the concave portion of the first surface of the first compound semiconductor layer and the first electrode may be formed on the convex portion of the first surface of the first compound semiconductor layer.

Further, in the light emitting element according to the second embodiment of the present disclosure including the above-described various preferred modes, the height of the step portion may be less than the thickness of the first compound semiconductor layer or the height of the step portion may be in the range of $1 \times 10^{-8}$ m to $1 \times 10^{-5}$ m.

Further, in the light emitting element according to the second embodiment of the present disclosure including the above-described various preferred modes, it is preferable that the value of the surface roughness Ra of the first surface of the first compound semiconductor layer on the inside of the step portion be $3 \times 10^{-9}$ m or less and the value of the surface roughness Ra of the first surface of the first compound semiconductor layer on the outside of the step portion exceed the value of the surface roughness Ra of the first surface of the first compound semiconductor layer on the inside of the step portion.

Further, in the light emitting element according to the second embodiment of the present disclosure including the above-described various preferred modes, it is desired that a relationship of $R_2/R_1 \leq 1$ be satisfied when the contact resistance value in the first surface of the first compound semiconductor layer on the inside of the step portion is set as $R_1$ and the contact resistance value of the first surface of the first compound semiconductor layer on the outside of the step portion is set as $R_2$.

Further, in the light emitting element according to the first embodiment or the second embodiment of the present disclosure including the above-described various preferred modes, the first light reflection layer may be in contact with the first electrode. Alternatively, the first light reflection layer is separated from the first electrode, that is, there is an offset between the first light reflection layer and the first electrode, and the separation distance may be within 1 mm. When an element area (described below) positioned in the inside of the first light reflection layer is separated from the first electrode, a current flows in the first compound semiconductor layer over a long distance. Accordingly, it is preferable that the separation distance be within 1 mm to suppress the electric resistance generated from a current path to be low.

Further, in the light emitting element according to the first embodiment or the second embodiment of the present disclosure including the above-described various preferred modes, it is preferable that the distance between the first light reflection layer and the second light reflection layer be in the range of 0.15 µm to 50 µm.

Further, in the light emitting element according to the first embodiment or the second embodiment of the present disclosure including the above-described various preferred modes, the second light reflection layer may be fixed to the support substrate.

Further, in the light emitting element according to the first embodiment or the second embodiment of the present disclosure including the above-described various preferred modes, the light generated from the active layer may be emitted to the outside through the first light reflection layer. In addition, in this case, when the area of a portion (portion of the first light reflection layer facing the second light reflection layer) of the first light reflection layer in contact with the first surface of the first compound semiconductor layer is set as $S_1$ and the area of a portion (portion of the second light reflection layer facing the first light reflection layer) of the second light reflection layer facing the second surface of the second compound semiconductor layer is set as $S_2$, it is desired that a relationship of $S_1 > S_2$ be satisfied.

In the method of producing the light emitting element according to the first embodiment of the present disclosure, in the process (e), the rough surface area is formed on the first surface of the first compound semiconductor layer, the first light reflection layer formed of the multilayer film is formed on at least the flat area which is a portion of the first surface of the first compound semiconductor layer surrounded by the rough surface area, and the first electrode is formed on at least the rough surface area, but specifically, the following formation procedures may be exemplified.

(e-1) formation of the first light reflection layer, formation of the rough surface area in the first surface of the first compound semiconductor layer, and formation of the first electrode (e-2) formation of the rough surface area in the first surface of the first compound semiconductor layer, the formation of the first electrode, and the formation of the first light reflection layer (e-3) formation of the rough surface area in the first surface of the first compound semiconductor layer, formation of the first light reflection layer, and formation of the first electrode Further, in the method of producing the light emitting element according to the second embodiment of the present disclosure, in the process (e), the step portion is formed on the first surface of the first compound semiconductor layer, the first light reflection layer formed of the multilayer film is formed on at least the inside of the step portion, and the first electrode is formed on at least the step portion, but specifically, the following formation procedures may be exemplified.

(e-1) formation of the first light reflection layer, formation of the step portion in the first surface of the first compound semiconductor layer, and formation of the first electrode (e-2) formation of the step portion in the first surface of the first compound semiconductor layer, the formation of the first electrode, and the formation of the first light reflection layer (e-3) formation of the step portion in the first surface of the first compound semiconductor layer, formation of the first light reflection layer, and formation of the first electrode As an arrangement state of the first light reflection layer and the first electrode in the first surface of the first compound semiconductor layer, as described above, a state in which the first light reflection layer is in contact with the first electrode or a state in which the first light reflection layer is separated from the first electrode may be exemplified, and a state in which the first electrode is formed even on an edge portion of the first light reflection layer or a state in which the first light reflection layer is formed even on an edge portion of the first electrode may be exemplified in some cases. Here, when a case where the state in which the first light reflection layer is formed even on the edge portion of the first electrode is set, the first electrode is necessary to include an opening having a certain degree of size so as not to absorb basic mode light of laser oscillation as much as possible. The size of the opening is not limited since it varies depending on the wavelength of a basic mode and a light confining structure in the lateral direction (in-plane direction of the first compound semiconductor layer), but several times of order of the oscillation wavelength $\lambda$ is preferable.

In the light emitting element or the like according to the first embodiment or the second embodiment of the present disclosure including the above-described various preferred modes, the first electrode may be formed of a metal or an alloy and the second electrode may be formed of a transparent conductive material. A current can spread in the lateral direction (in-plane direction of the second compound semiconductor layer) and can be efficiently supplied to an element area (described below) by constituting the second electrode with the transparent conductive material. It is preferable that the second electrode be formed on the second surface of the second compound semiconductor layer and the second light reflection layer be formed on the second electrode.

Here, the term "element area" means an area in which a constricted current is injected, an area in which light is confined by a refractive index difference, an area from which laser oscillation is generated in the area interposed between the first light reflection layer and the second light reflection layer, or an area practically contributing to the laser oscillation in the area interposed between the first light reflection layer and the second light reflection layer.

As described above, the light emitting element may be formed of a surface light emitting laser element (vertical resonator laser, VCSEL) emitting light through the first light reflection layer from the top surface of the first compound semiconductor layer or may be formed of a surface light emitting laser element emitting light through the second light reflection layer from the top surface of the second compound semiconductor layer.

Further, in the light emitting element according to the first embodiment or the second embodiment of the present disclosure including the above-described various preferred modes and in the method of producing the light emitting element according to the first embodiment or the second embodiment of the present disclosure including the above-described various modes (hereinafter, also collectively and simply referred to as "the present disclosure"), the laminated structure may specifically include an AlGaInN-based compound semiconductor. Here, specific examples of the AlGaInN-based compound semiconductor may include GaN, AlGaN, GaInN, and AlGaInN. Further, these compound semiconductors may contain a boron (B) atom, a thallium (Tl) atom, an arsenic (As) atom, a phosphorus (P) atom, and an antimony (Sb) atom, preferably. The active layer may preferably have a quantum well (QW structure) or a multiplex quantum well structure (MQW structure). The active layer having a quantum well structure has a structure in which at least one of well layer and barrier layer are laminated, and examples of the combination of (a compound semiconductor constituting a well layer and a compound semiconductor constituting a barrier layer) may include $(In_yGa_{(1-y)}N, GaN)$, $(In_yGa_{(1-y)}N, In_zGa_{(1-z)}N)$ [where, y>z], and $(In_yGa_{(1-y)}N, AlGaN)$. The first compound semiconductor layer may be formed of a first conductive (for example, n-type) compound semiconductor and the second compound semiconductor layer may be formed of a second conductive (for example, p-type) compound semiconductor which is different from the first conductive compound semiconductor. The first compound semiconductor layer and the second compound semiconductor layer are referred to as a first clad layer and a second clad layer. It is preferable that a current constricted structure be formed between the second electrode and the second compound semiconductor layer. The first compound semiconductor layer and the second compound semiconductor layer may be a single layer structure, a multilayer structure, or a superlattice structure. Further, the layer may be a layer including a composition inclined layer and a concentration inclined layer.

For obtaining the current constricted structure, a current constricted layer formed of an insulating material (for example, $SiO_2$, SiN, or $Al_2O_3$) may be formed between the second electrode and the second compound semiconductor layer, a mesa structure may be formed by etching the second compound semiconductor layer with an RIE method or the like, a current constricted area may be formed by partially oxidizing a part of the laminated second compound semiconductor layer in the lateral direction, an area in which conductivity is degraded by carrying out ion-injecting of impurities to the second compound semiconductor layer may be formed, or these may be combined. However, the second electrode is necessary to be electrically in contact with the part of the second compound semiconductor layer in which a current flows due to the current constriction.

Examples of the substrate for a light emitting element include a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and a substrate with a base layer or a buffer layer formed on the surface (principal surface) of one of these substrates. In a case where the GaN-based compound semiconductor layer is formed on a substrate, it is preferable to use the GaN substrate from a viewpoint of low defect density. It is known that the characteristic of the GaN substrate is changed based on, for example, polarity, nonpolarity, or semipolarity, due to a growth surface, but any principal surface of the GaN substrates can be used to form a compound semiconductor layer. In addition, in regard to the principal surface of these substrates, a crystal azimuth surface such as a so-called A surface, B surface, C surface, R surface, M surface, N surface, or an S surface, or a surface in which these are offset in the specific direction may be used according to a crystal structure (for example, a cubic structure or a hexagonal structure). Examples of a method of forming various compound semiconductor layers constituting the light emitting element include an organic metal chemical vapor phase growth method (an MOCVD method, an MOVPE method), a molecular beam epitaxy method (MBE method), and a hydride vapor phase growth method in which a halogen contributes to transportation or a reaction.

Here, examples of organic gallium source gas in the MOCVD method include trimethyl gallium (TMG) gas and triethyl gallium (TEG) gas, and examples of nitrogen source gas include ammonia gas and hydrazine gas. In formation of the GaN-based compound semiconductor layer having an n-type of conductivity, for example, silicate (Si) may be added as an n-type impurity (n-type dopant). In addition, in formation of the GaN-based compound semiconductor layer having a p-type conductivity, for example, magnesium (Mg) may be added as a p-type impurity (p-type dopant). In a case where aluminum (Al) or indium (In) is included as a constituent atom of the GaN-based compound semiconductor layer, trimethyl aluminum (TMA) gas may be used as an Al source and trimethyl indium (TMI) gas may be used as an In source. Further, monosilane gas ($SiH_4$ gas) may be used as a Si source and cyclopentadienyl magnesium gas, methylcyclo pentadienyl magnesium, or biscyclopentadienyl magnesium ($Cp_2Mg$) may be used as a Mg source. Further, examples of the n-type impurities (n-type dopant) include Ge, Se, Sn, C, Te, S, O, Pd, and Po in addition to Si and examples of the p-type impurities (p-type dopant) include Zn, Cd, Be, Ca, Ba, C, Hg, and Sr in addition to Mg.

The support substrate may be formed from various substrates exemplified above as the substrate for producing the light emitting element or may be formed from an insulating substrate containing AlN and the like, a semiconductor substrate containing Si, SiC, Ge, and the like, a metal substrate, or an alloy substrate, but a substrate having conductivity may be preferably used or a metal substrate or an alloy substrate may be preferably used from viewpoints of mechanical characteristics, elastic deformation, plastic deformation, and heat radiation. The thickness of the support substrate may be, for example, in the range of 0.05 mm to 0.5 mm. As a method of fixing the second light reflection layer to the support substrate, a solder bonding method, a room-temperature bonding method, or a method using an adhesive tape, a bonding method using wax bonding, or an existing method may be used, but a solder bonding method or a room-temperature bonding method is desirably adopted from the viewpoint of ensuring conductivity. For example, in a case where the silicon semiconductor substrate which is a conductive substrate is used as the support substrate, for suppressing warpage due to a difference in thermal expansion coefficient, it is desired to adopt a method in which the layer can be bonded to the substrate at a low temperature equal to or lower than 400° C. When the GaN substrate is used as the support substrate, the bonding temperature may be 400° C. or higher.

It is desired that the first electrode include a single layer structure or a multilayer structure containing at least one kind of metal (including an alloy) selected from a group consisting of gold (Au), silver (Ag), palladium (Pd), platinum (Pt), nickel (Ni), titanium (Ti), vanadium (V), tungsten (W), chrome (Cr), aluminum (Al), copper (Cu), zinc (Zn), tin (Sn), and indium (In), and specific examples thereof may include Ti/Au, Ti/Al, Ti/Al/Au, Ti/Pt/Au, Ni/Au, Ni/Au/Pt, Ni/Pt, Pd/Pt, and Ag/Pd. In addition, the layer before the slash in the multilayer structure is positioned on the active layer side. The same applies to the description below. The first electrode can be formed using, for example, a PVD method such as a vacuum deposition method or a sputtering method.

Examples of the transparent conductive material constituting the second electrode include an indium-tin oxide (ITO, including $In_2O_3$ of Sn dope, crystalline ITO, and amorphous ITO), an indium-zinc oxide (IZO), IFO ($In_2O_3$ of F dope), tin oxide ($SnO_2$), ATO ($SnO_2$ of Sb dope), FTO ($SnO_2$ of F dope), and zinc oxide (ZnO, including ZnO of Al dope or ZnO of B dope). Alternatively, as the second electrode, a transparent conductive film using a gallium oxide, a titanium oxide, a niobium oxide, or a nickel oxide as a base layer can be exemplified. However, the materials constituting the second electrode depend on the arranged state of the second light reflection layer and the second electrode, but are not limited to the transparent conductive materials, and metals such as palladium (Pd), platinum (Pt), nickel (Ni), gold (Au), cobalt (Co), and rhodium (Rh) can be used. The second electrode may be formed of at least one kind of the above-described materials. The second electrode may be formed using the PVD method, for example, a vacuum deposition method or a sputtering method.

A pad electrode may be provided for electrical connection to an external electrode or an external circuit on the first electrode or the second electrode. It is desirable that the pad electrode contain a single layer structure or a multilayer structure containing at least one kind of metal selected from a group consisting of titanium (Ti), aluminum (Al), platinum (Pt), gold (Au), nickel (Ni), and palladium (Pd). Alternatively, the pad electrode can be made to have one of the exemplified multilayer structures of Ti/Pt/Au, Ti/Au, Ti/Pd/Au, Ti/Ni/Au, and Ti/Ni/Au/Cr/Au. In a case where the first electrode is formed of an Ag layer or an Ag/Pd layer, it is preferable that a cover metal layer formed of, for example, Ni/TiW/Pd/TiW/Ni be formed on the surface of the first electrode and a pad electrode formed of, for example, a multilayer structure of T/Ni/Au or Ti/Ni/Au/Cr/Au be formed on the cover metal layer.

The light reflection film (distributed bragg reflector film, DBR film) is formed of, for example, a semiconductor multilayer film or a dielectric multilayer film. Examples of the dielectric material may include an oxide such as Si, Mg, Al, Hf, Nb, Zr, Sc, Ta, Ga, Zn, Y, B, or Ti; a nitride such as AlN, AlGaN, GaN, or BN; and a fluoride. Specific examples thereof may include $SiO_2$, $TiO_2$, $Nb_2O_5$, $ZrO_2$, $Ta_2O_5$, ZnO, $Al_2O_3$, $HfO_2$, and AlN. In addition, a light reflection layer can be obtained by alternatively laminating two or more kinds of dielectric films formed of dielectric materials having different refractive indexes from each other from among these dielectric materials. For example, a multilayer film such as $SiO_2$/SiN, $SiO_2$/$Nb_2O_5$, $SiO_2$/$ZrO_2$, or $SiO_2$/AlN is preferable. For obtaining a desired reflectance, a material constituting each dielectric film, a film thickness, the number of laminated layers may be appropriately selected. The thickness of each dielectric film may be appropriately adjusted by the material being used and is determined by an oscillation wavelength $\lambda$ and a refractive index n at the oscillation wavelength $\lambda$ of the material being used. Specifically, odd number times of $\lambda/(4n)$ is preferable. For example, in the light emitting element whose oscillation wavelength $\lambda$, is 410 nm, in a case where the light reflection layer is formed of $SiO_2$/$Nb_2O_5$, the range of 40 nm to 70 nm can be exemplified. The number of laminated layers may be 2 or more and preferably 5 to 20. The thickness of the entire light reflection layer may be, for example, 0.6 μm to 1.7 μm.

The size or the shape of the light reflection layer is not particularly limited as long as the light reflection layer covers the element area. Specific examples of the planar shape of the opening which is provided in the element area, the first light reflection layer, the second light reflection layer, or the current constricted layer may include a circular shape, an elliptical shape, a square shape, and a polygonal shape (a triangular shape, a rectangular shape, or a hexagonal shape). In addition, as the planar shape of the first electrode, an annular shape can be exemplified. The planar shape of the opening which is provided in the element area, the first light reflection layer, the second light reflection layer, or the current constricted layer and the planar shape of an annular portion inside the annular first electrode are desirably similar to each other. In a case of a circular shape, the diameter thereof is preferably in the range of 2 μm to 70 μm.

The light reflection layer can be formed using an existing method, and specific examples thereof may include PVD methods such as a vacuum deposition method, a sputtering method, a reactive sputtering method, an ECR plasma sputtering method, a magnetron sputtering method, an ion beam assist deposition method, an ion plating method, and a laser ablation method, various CVD methods, coating methods such as a spray method, a spin coat method, a dipping method, a method of combining two or more kinds of these methods, and a method of combining one or more kinds of an overall or partial pretreatment, irradiation of inert gas (Ar, He, or Xe) or plasma, irradiation of oxygen gas, ozone gas or plasma, an oxidation treatment (heat treatment), and an exposure treatment.

Moreover, the side surface or the exposed surface of the laminated structure may be coated with an insulation film. The formation of the insulation film can be performed using an existing method. It is preferable that the refractive index of the material constituting the insulation film be smaller than that of the material constituting the laminated structure. Examples of the material constituting the insulation film may include a $SiO_X$-based material containing $SiO_2$, a $SiN_Y$-based material, a $SiO_XN_Y$-based material, $Ta_2O_5$, $ZrO_2$, AlN, $Al_2O_3$, $Ga_2O_3$, and an organic material such as a polyimide resin. Examples of a method of forming the insulation film may include a PVC method such as a vacuum deposition method or a sputtering method and a CVD method, and the insulation film may be formed based on the coating method.

Example 1

Example 1 relates to a light emitting element according to the first embodiment and the second embodiment of the present disclosure and to a method of producing the light emitting element according to the first embodiment and the second embodiment.

The light emitting element of Example 1 shown in FIG. 1A which is a schematic partial end view includes (A) a laminated structure 20 on which a first compound semiconductor layer 21 that is formed of a GaN-based compound semiconductor and includes a first surface 21a and a second surface 21b facing the first surface 21a, an active layer (light emitting layer) 23 that is formed of the GaN-based compound semiconductor and is in contact with the second surface 21b of the first compound semiconductor layer 21, and a second compound semiconductor layer 22 that is formed of the GaN-based compound semiconductor, includes a first surface 22a and a second surface 22b facing the first surface 22a, and whose first surface 22a is in contact with the active layer 23 are laminated; (B) a first light reflection layer 41 that is formed of a first electrode 31 formed on the first surface 21a of the first compound semiconductor layer 21 and a multilayer film formed on the first surface 21a of the first compound semiconductor layer 21; and (C) a second light reflection layer 42 that is formed of a second electrode 32 and a multilayer film formed on the second surface 22b of the second compound semiconductor layer 22.

Specifically, the light emitting element of Example 1 is formed of a surface light emitting laser element (vertical resonator laser, VCSEL) emitting light through the first light reflection layer 41 from the top surface of the first compound semiconductor layer 21.

Further, the first surface 21a of the first compound semiconductor layer 21 has a flat area 21A and a rough surface area 21B which is rougher than the flat area 21A, the first light reflection layer 41 is formed on at least the flat area 21A, and the first electrode 31 is formed on at least the rough surface area 21B. Here, the rough surface area 21B surrounds the flat area 21A.

Alternatively, a step portion 21C is formed on the first surface 21a of the first compound semiconductor layer 21, the first light reflection layer 41 is formed on at least the inside 21D of the step portion 21C, and the first electrode 31 is formed on at least the outside 21E of the step portion 21C. Here, the step portion 21C is formed of a simple closed curve. In addition, the first light reflection layer 41 is formed on a convex portion of the first surface 21a of the first compound semiconductor layer 21, and the first electrode 31 is formed on a concave portion of the first surface 21a of the first compound semiconductor layer 21. The height of the step portion 21C is less than the thickness of the first compound semiconductor layer 21 and the height of the step portion 21C is in the range of $1 \times 10^{-8}$ m to $1 \times 10^{-5}$ m, and specifically, for example, $2 \times 10^{-6}$ m. Further, the distance between the first light reflection layer 41 and the second light reflection layer 42 is in the range of 0.15 µm to 50 µm, and specifically, for example, 10 µm.

In the light emitting element of Example 1, a current constricted layer 24 formed of an insulating material such as $SiO_2$ is formed between the second electrode 32 and the second compound semiconductor layer 22. A circular opening 24A is formed in the current constricted layer 24 and the second compound semiconductor layer 22 is exposed to the bottom portion of the opening 24A. The second electrode 32 is formed from the second surface 22b of the second compound semiconductor layer 22 to the current constricted layer 24, and the second light reflection layer 42 is formed on the second electrode 32. Further, a pad electrode 33 is in contact with the edge portion of the second electrode 32 for electrical connection to the external electrode or the external circuit. The planar shape of the element area is circular and the planar shape of the opening 24A provided in the first light reflection layer 41, the second light reflection layer 42, or the current constricted layer 24 is also circular. On the other hand, the planar shape of the first electrode 31 is annular (ring shape). Further, the first light reflection layer 41 and the second light reflection layer 42 have a multilayer structure, but for simplifying drawings, the structure is expressed by one layer. Furthermore, the formation of the current constricted layer 24 is optional.

In the light emitting element of Example 1, the first light reflection layer 41 is separated from the first electrode 31, that is, there is an offset between the first light reflection layer and the first electrode, and the separation distance may be within 1 mm, specifically, for example, 0.05 mm in average.

In the light emitting element of Example 1, the second light reflection layer 42 is fixed to a support substrate 26 formed of a silicon semiconductor substrate through a bonding layer 25 formed of a solder layer containing a gold (Au) layer or a tin (Sn) layer based on a solder bonding method.

Further, in the light emitting element of Example 1, the light generated from the active layer 23 may be emitted to the outside through the first light reflection layer 41. When the area of a portion (portion of the first light reflection layer 41 facing the second light reflection layer 42) of the first light reflection layer 41 in contact with the first surface 21a of the first compound semiconductor layer 21 is set as $S_1$ and the area of a portion (portion of the second light reflection layer 42 facing the first light reflection layer 41) of the second light reflection layer 42 facing the second surface of the second compound semiconductor layer 22 is set as $S_2$, a relationship of $S_1 > S_2$ be satisfied.

The first compound semiconductor layer 21 is formed of an n-GaN layer, the active layer 23 has a five-layered multiplex quantum well structure in which an $In_{0.04}Ga_{0.96}N$ layer (barrier layer) and an $In_{0.16}Ga_{0.84}N$ layer (well layer) are laminated, and the second compound semiconductor layer 22 is formed of a p-GaN layer. In addition, the first electrode 31 is formed of Ti/Pt/Au, the second electrode 32 is formed of a transparent conductive material, specifically, ITO, the pad electrode 33 is formed of Ti/Pd/Au, and the first light reflection layer 41 and the second light reflection layer 42 are formed of a multilayer structure (total number of laminated dielectric films: 20 layers) of a SiN layer and a $SiO_2$ layer.

Hereinafter, the method of producing the light emitting element of Example 1 will be described with reference to FIGS. 12A, 12B, 12C, 13A, 13B, and 14 which are partial end views schematically illustrating the laminated structure or the like.

Process-100

First, the laminated structure 20 on which the first compound semiconductor layer 21 that is formed of the GaN-based compound semiconductor and includes the first surface 21a and the second surface facing the first surface 21a, the active layer 23 that is formed of the GaN-based compound semiconductor and is in contact with the second surface 21b of the first compound semiconductor layer 21, and the second compound semiconductor layer 22 that is formed of the GaN-based compound semiconductor, includes the first surface 22a and the second surface 22b facing the first surface 22a, and whose first surface 22a is in contact with the active layer 23 are laminated on a substrate 11 for producing the light emitting element formed of the GaN substrate is formed based on the existing MOCVD method. Further, the current constricted layer 24 including the opening 24A is formed on the second compound semiconductor layer 22 based on an existing method. In this way, the structure shown in FIG. 12A can be obtained.

Process-110

Next, the second light reflection layer 42 formed of the second electrode 32 and the multilayer film is formed on the second surface 22b of the second compound semiconductor layer 22. Specifically, the second electrode 32 is formed from the second surface 22b of the second compound semiconductor layer 22 to the current constricted layer 24 based on a lift-off method, and the pad electrode 33 is formed from the second electrode 32 to the current constricted layer 24 based on an existing method. In this way, the structure shown in FIG. 12B can be obtained. Subsequently, the second light reflection layer 42 is formed from the second electrode 32 to the pad electrode 33 based on an existing method. In this way, the structure shown in FIG. 12C can be obtained.

Process-120

Next, the second light reflection layer 42 is fixed to the support substrate 26 through the bonding layer 25. In this way, the structure shown in FIG. 13A can be obtained.

Process-130

Subsequently, the substrate 11 for producing the light emitting element is eliminated and the first surface 21a of the first compound semiconductor layer 21 is exposed. Specifically, first, the thickness of the substrate 11 for producing the light emitting element is made to be thin based on a mechanical polishing method, a remainder of the substrate 11 for producing the light emitting element is eliminated, the exposed first compound semiconductor layer 21 is partially eliminated in the thickness direction, and a mirror finish treatment with respect to the first surface 21a of the first compound semiconductor layer 21 is carried out. In this way, the structure shown in FIG. 13B can be obtained.

Process-140

Subsequently, the rough surface area 21B is formed on the first surface 21a of the first compound semiconductor layer 21, the first light reflection layer 41 formed of a multilayer film is formed in the flat area 21A which is a portion of the first surface 21a of the first compound semiconductor layer 21 surrounded by the rough surface area 21B, and the first electrode 31 is formed on at least the rough surface area 21B. Alternatively, subsequently, the step portion 21C is formed in the first surface 21a of the first compound semiconductor layer 21, the first light reflection layer 41 formed of a multilayer film is formed on at least the inside 21D of the step portion 21C, and the first electrode 31 is formed on at least the outside 21E of the step portion 21C.

Specifically, a resist layer for etching is formed on the area of the first compound semiconductor layer 21 which is the flat area 21A or the area of the first compound semiconductor layer 21 corresponding to the inside 21D of the step portion 21C based on an existing method, the rough surface area 21B is formed by etching the area of the exposed first compound semiconductor layer 21 based on the RIE method, or the step portion 21C is formed. In this way, the structure shown in FIG. 14 can be obtained.

Figure 15A:
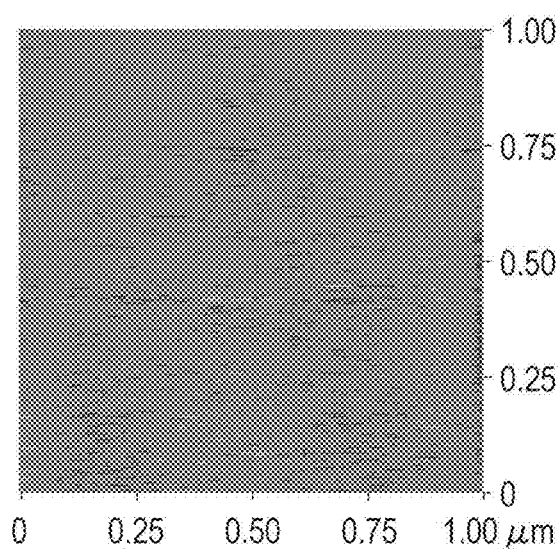
FIGS. 15A and 15B are views showing observation results of the state of the first compound semiconductor layer before carrying out etching and the state of the first compound semiconductor layer after carrying out etching based on a RIE method using an AFM.
Figure 15B:
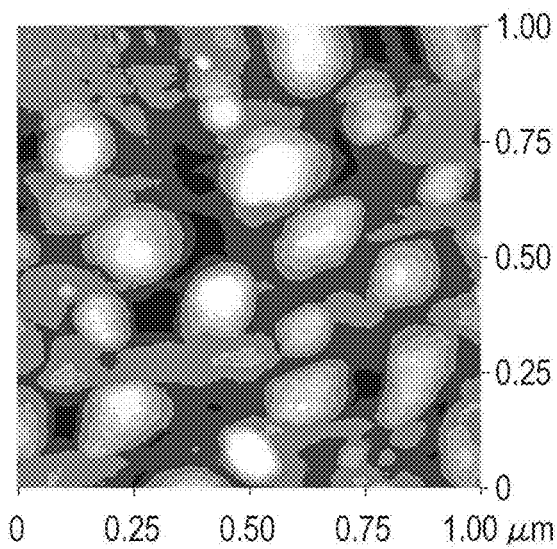
Figure 16A:
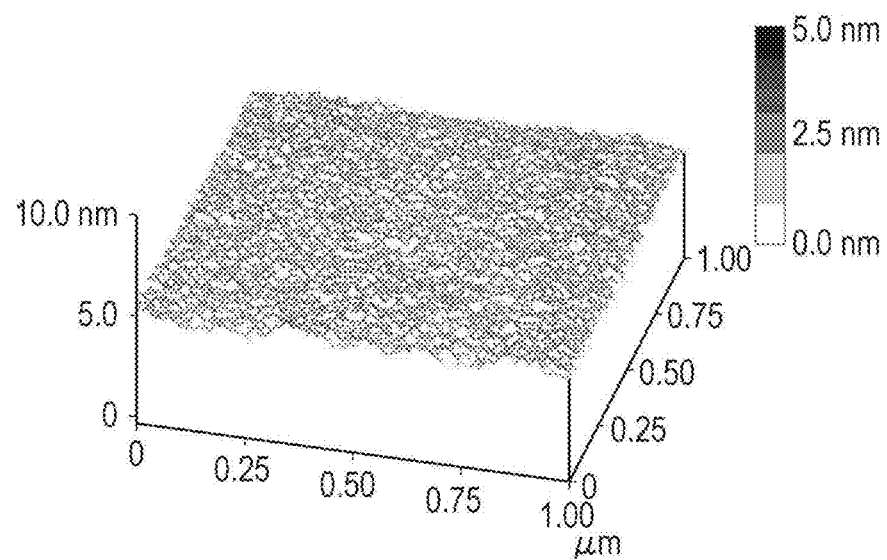
FIGS. 16A and 16B are views showing analysis results of surface roughness Ra of the first compound semiconductor layer before carrying out etching and surface roughness Ra of the first compound semiconductor layer after carrying out etching based on the RIE method.
Figure 16B:
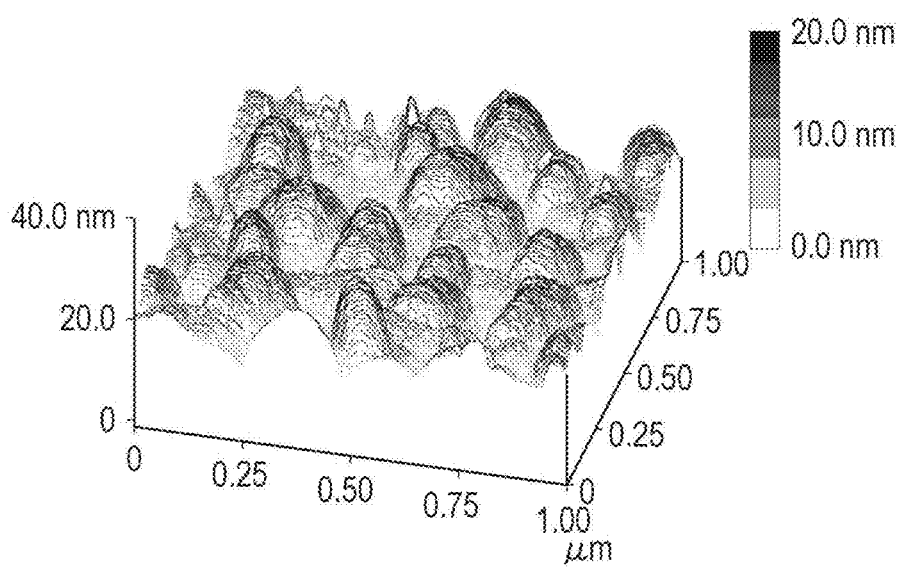

Here, the value of the surface roughness Ra of the flat area 21A is $3 \times 10^{-9}$ m or less and the value of the surface roughness Ra of the rough surface area 21B exceeds the value of the surface roughness Ra of the flat area 21A. Specifically, the value of the surface roughness Ra of the flat area 21A is 0.2 nm and the value of the surface roughness Ra of the rough surface area 21B is 3.1 nm. The state of the first compound semiconductor layer 21 before etching and the state of the first compound semiconductor layer 21 after etching based on the RIE method is observed by an AFM. The results are shown in FIG. 15A (before etching) and FIG. 15B (after etching) and the analysis results of the surface roughness Ra are shown in FIG. 16A (before etching) and FIG. 16B (after etching).

In addition, when the contact resistance value in the flat area 21A is set as $R_1$ and the contact resistance value in the rough surface area 21B is set as $R_2$, a relationship of $R_2/R_1 \leq 1$ is satisfied. Specifically, a IV curve in the flat area 21A is a schottky type and the IV curve in the rough surface area 21B is an ohmic type.

Next, the first light reflection layer 41 is formed in the flat area 21A of the first compound semiconductor layer 21 or the inside 21D of the step portion 21C based on an existing method. Subsequently, the first electrode 31 is formed in the rough surface area 21B of the first compound semiconductor layer 21 or the outside 21E of the step portion 21C based on an existing method. In this way, the light emitting element of Example 1 having the structure shown in FIG. 1A can be obtained.

The order of the formation of the rough surface area 21B (step portion 21C) in the first surface 21a of the first compound semiconductor layer 21, the formation of the first light reflection layer 41, and the formation of the first electrode 31 is not limited to the above-described order of the formation of the first light reflection layer 41, the formation of the rough surface area 21B (step portion 21C) in the first surface 21a of the first compound semiconductor layer 21, and the formation of the first electrode 31, the order of the formation of the first light reflection layer 41, the formation of the rough surface area 21B (step portion 21C) in the first surface 21a of the first compound semiconductor layer 21, and the formation of the first electrode 31 may be used, and the order of the formation of the rough surface area 21B (step portion 21C) in the first surface 21a of the first compound semiconductor layer 21, the formation of the first electrode 31, and the formation of the first light reflection layer 41 may be used. In addition, the resist layer for etching in the process-140 can be replaced by the first light reflection layer 41.

Process-150

Next, the light emitting element is separated by performing so-called element separation and the side surface or the exposed surface of the laminated structure is coated with an insulation film formed of, for example, $SiO_2$. Subsequently, a terminal or the like for connecting the first electrode 31 or the pad electrode 33 to an external circuit or the like is formed based on an existing method and the light emitting element of Example 1 is completed by packaging or sealing the terminal.

In the light emitting element of Example 1, the first surface of the first compound semiconductor layer has the flat area and the rough area, the first light reflection layer is formed on at least the flat area, and the first electrode is formed on at least the rough area. Alternatively, the step portion is formed on the first surface of the first compound semiconductor layer, the first light reflection layer is formed on at least the inside of the step portion, and the first electrode is formed on at least the outside of the step portion. Accordingly, light scattering on the surface of the first compound semiconductor layer can be minimized and increase in the contact resistance between the first compound semiconductor layer and the first electrode can be suppressed.

Further, in the method of producing the light emitting element of Example 1, the substrate for producing the light emitting element is eliminated and the first surface of the first compound semiconductor layer is exposed, the rough surface area is formed on the first surface of the first compound semiconductor layer, the first light reflection layer formed of the multilayer film is formed on at least the flat area which is a portion of the first surface of the first compound semiconductor layer surrounded by the rough area, and the first electrode is formed on at least the rough area. Alternatively, the substrate for producing the light emitting element is eliminated and the first surface of the first compound semiconductor layer is exposed, the step portion is formed on the first surface of the first compound semiconductor layer, the first light reflection layer formed of the multilayer film is formed on at least the inside of the step portion, and the first electrode is formed on at least the outside of the step portion, but the flat state in which the area of the first surface of the first compound semiconductor layer positioned on the inside of the step portion is maintained and the area of the first surface of the first compound semiconductor layer positioned on the outside of the step portion is roughened by the formation of the step portion. Accordingly, light scattering on the surface of the first compound semiconductor layer can be minimized and increase in the contact resistance between the first compound semiconductor layer and the first electrode can be suppressed.

Figure 1B:
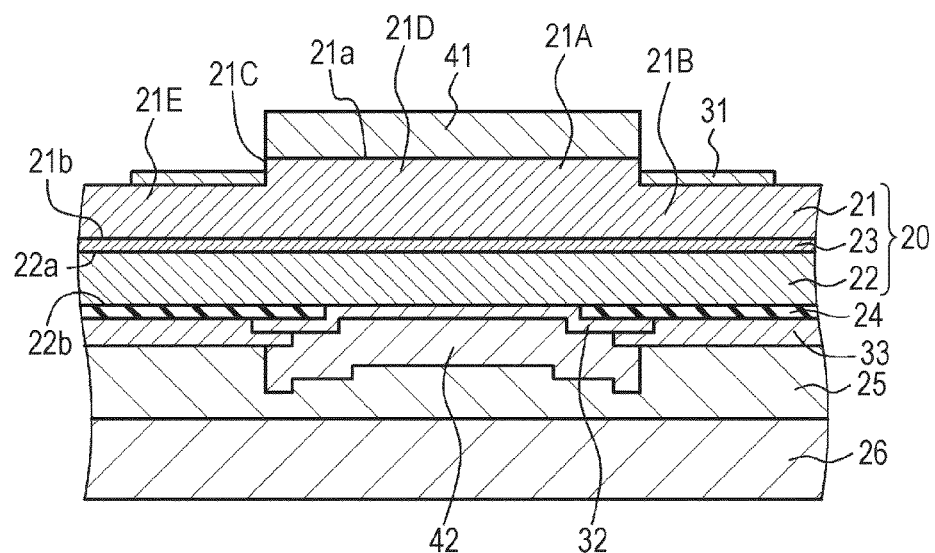
Figure 2A:
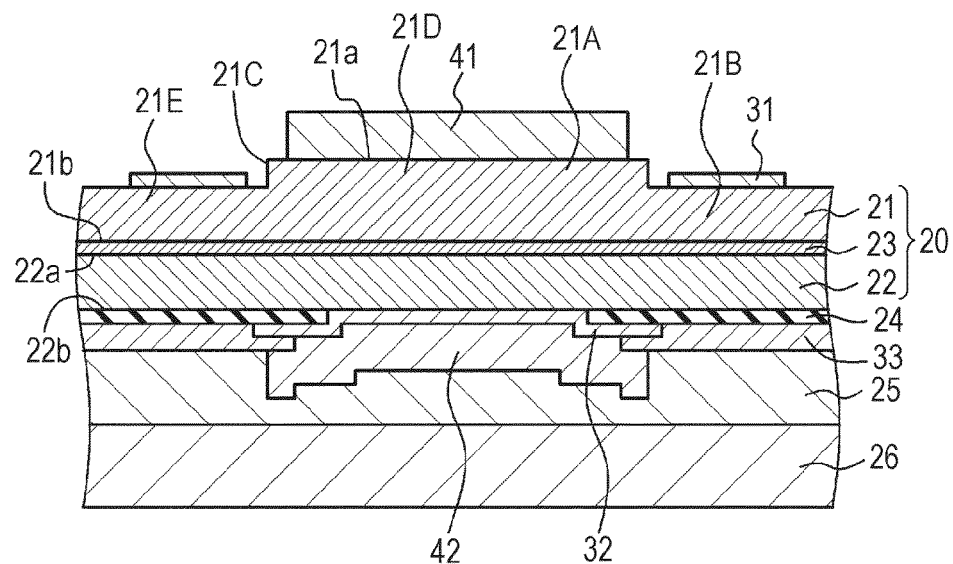
FIGS. 2A and 2B are respectively partial end views schematically illustrating the modification example of the light emitting element of Example 1.
Figure 2B:
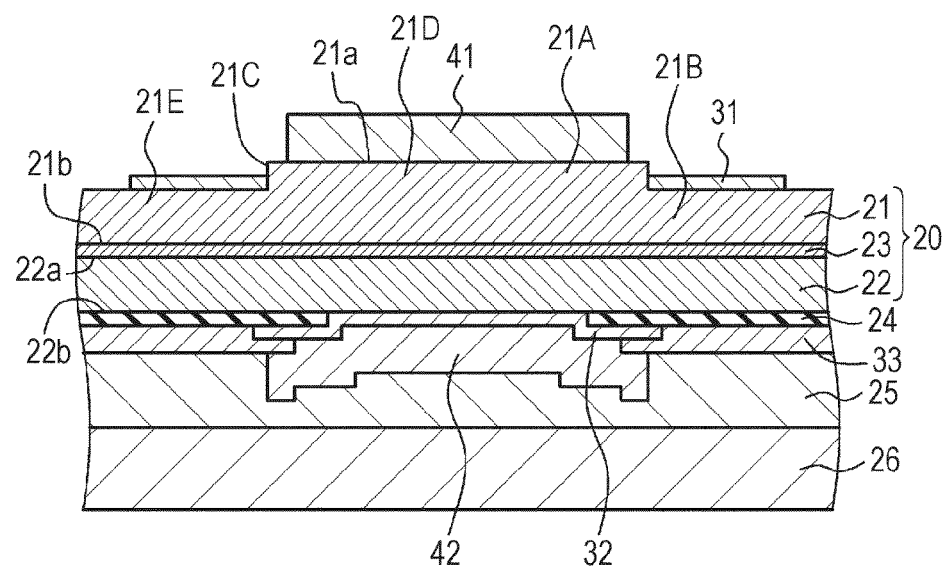

In the example of the light emitting element shown in FIG. 1A, the first light reflection layer 41 includes the flat area 21A or all the inside 21D of the step portion 21C, and the end portion of the first electrode 31 is separated from the step portion 21C. In contrast, in the example of the light emitting element shown in FIG. 1B, the first light reflection layer 41 includes the flat area 21A or all the inside 21D of the step portion 21C, and the end portion of the first electrode 31 is in contact with the step portion 21C. In addition, in the examples of the light emitting element shown in FIGS. 2A and 2B, the first light reflection layer 41 includes the flat area 21A or a part of the inside 21D of the step portion 21C. Further, the end portion of the first electrode 31 is separated from the step portion 21C (see FIG. 2A) or the end portion of the first electrode 31 is in contact with the step portion 21C (see FIG. 2B).

Figure 3A:
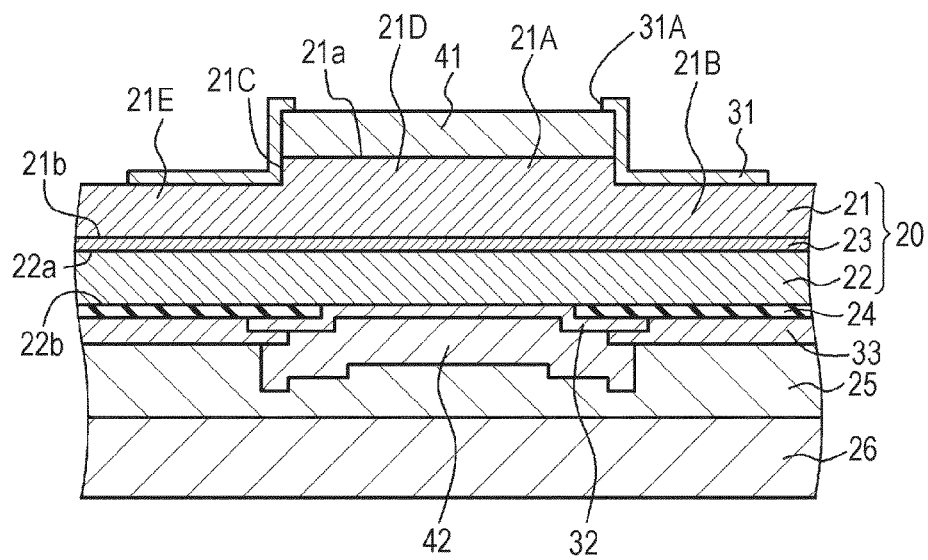
FIGS. 3A and 3B are respectively partial end views schematically illustrating the modification example of the light emitting element of Example 1.
Figure 3B:
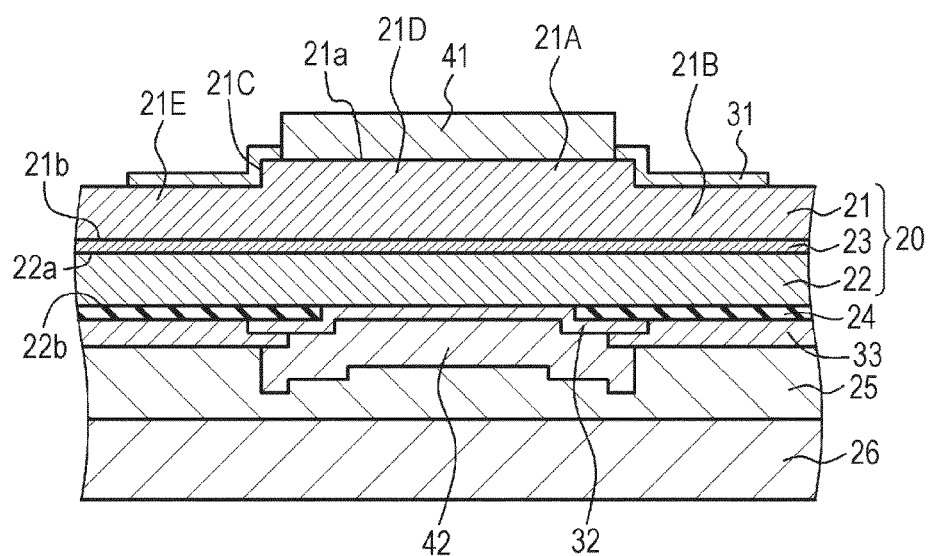
Figure 4A:
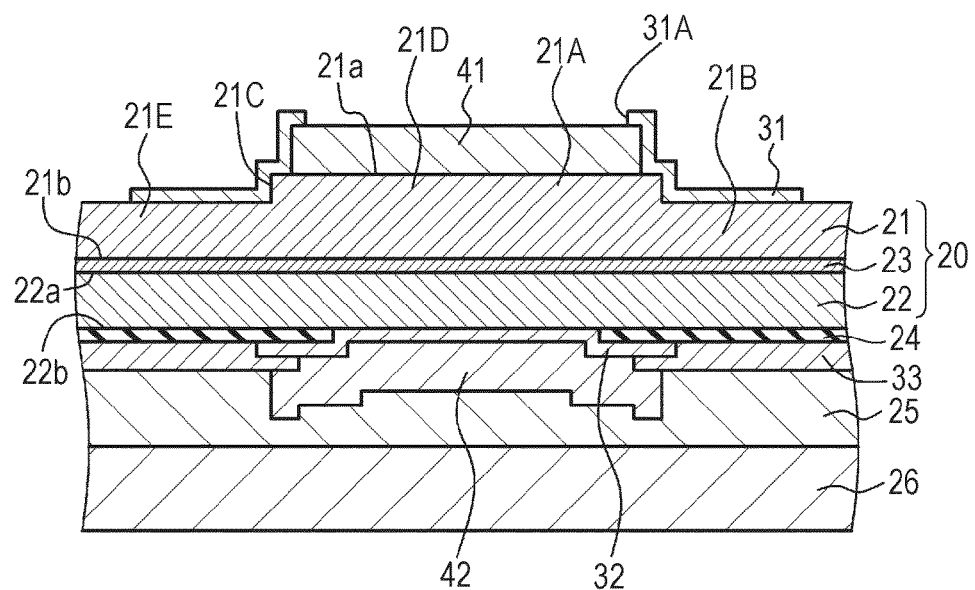
FIGS. 4A and 4B are respectively partial end views schematically illustrating the modification example of the light emitting element of Example 1.
Figure 4B:
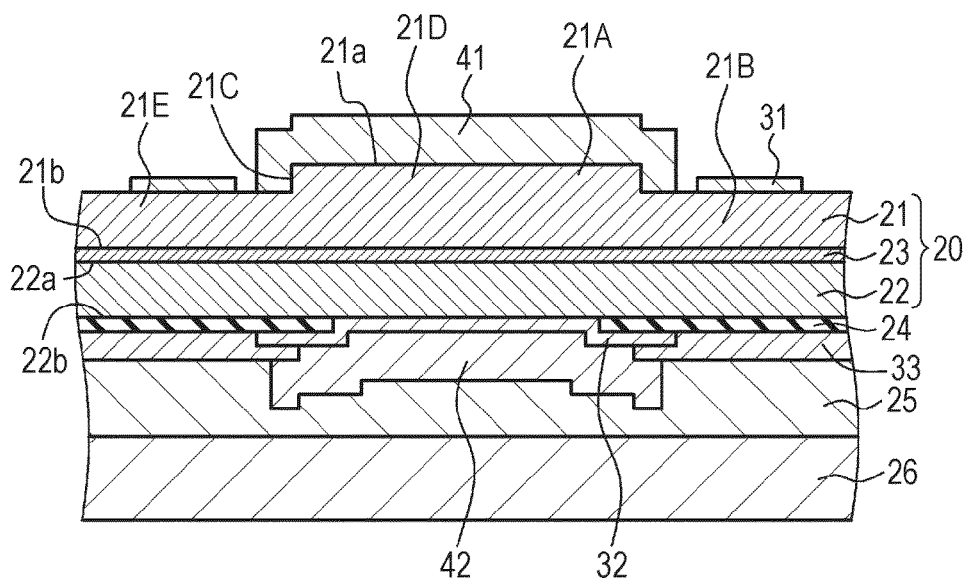
Figure 5A:
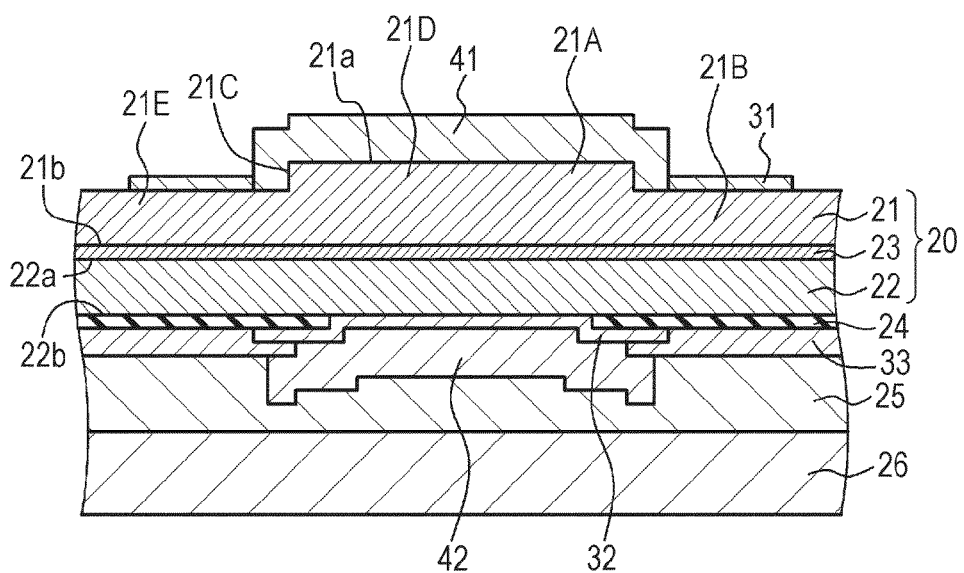
FIGS. 5A and 5B are respectively partial end views schematically illustrating the modification example of the light emitting element of Example 1.
Figure 5B:
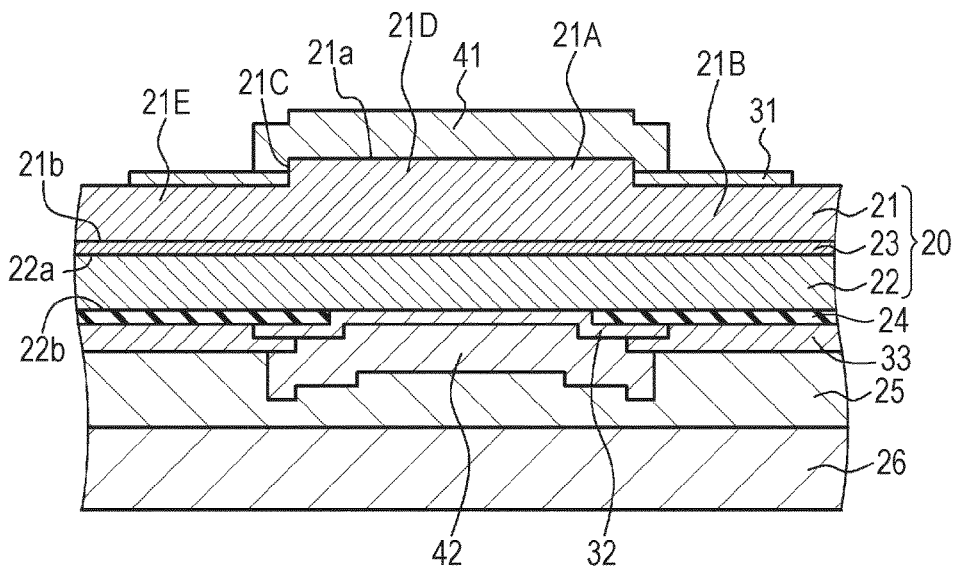
Figure 6A:
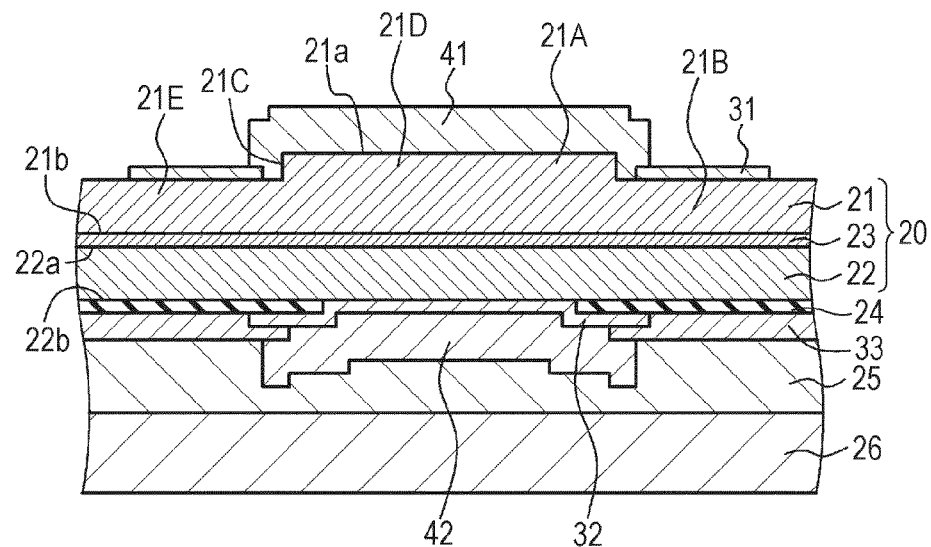
FIGS. 6A and 6B are respectively partial end views schematically illustrating the modification example of the light emitting element of Example 1.
Figure 6B:
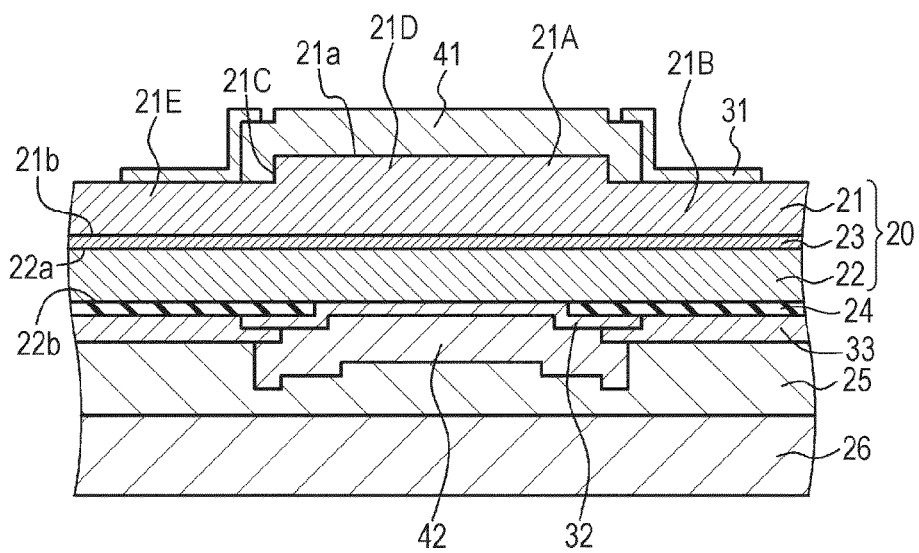

In the example of the light emitting element shown in FIG. 3A, the first light reflection layer 41 includes the flat area 21A or all the inside 21D of the step portion 21C, and the end portion of the first electrode 31 is formed from the step portion 21C to the edge portion of the first light reflection layer 41. That is, the first light reflection layer 41 is in contact with the first electrode 31. In addition, in the examples of the light emitting element shown in FIGS. 3B and 4A, the first light reflection layer 41 includes the flat area 21A or a part of the inside 21D of the step portion 21C. Further, the first electrode 31 extends from the step portion 21C to the edge portion of the flat area 21A (see FIG. 3B), and the first light reflection layer 41 is in contact with the first electrode 31. Alternatively, the first electrode 31 extends from the step portion 21C to the edge portion of the flat area 21A, further, to the edge portion of the first light reflection layer 41 (see FIG. 4A), and the first light reflection layer 41 is in contact with the first electrode 31. In a case where the first electrode 31 extends to the edge portion of the first light reflection layer 41, the opening 31A which does not absorb basic mode light of laser oscillation as much as possible, for example, the opening 31A having a diameter of 5 µm to 50 µm is formed in the first electrode 31. The same applies to the description below.

In the examples of the light emitting element shown in FIGS. 4B, 5A, 5B, 6A, and 6B, the first light reflection layer 41 includes the flat area 21A or all the inside 21D of the step portion 21C, and extends to the rough surface area 21B or the outside 21E of the step portion 21C. In addition, the end portion of the first electrode 31 is separated from the first light reflection layer 41 (see FIG. 4B). Alternatively, the end portion of the first electrode 31 is in contact with the first light reflection layer 41 (see FIG. 5A). Alternatively, the first light reflection layer 41 is formed on the end portion of the first electrode 31 and the first electrode 31 is in contact with the step portion 21C (see FIG. 5B). Alternatively, the first light reflection layer 41 is formed on the end portion of the first electrode 31 and the first electrode 31 is separated from the step portion 21C (see FIG. 6A). Alternatively, the first electrode 31 extends to the edge portion of the first light reflection layer 41 (see FIG. 6B).

Example 2

Example 2 is a modification of Example 1. In the light emitting element of Example 2, the first light reflection layer 41 is formed on the concave portion of the first surface 21a of the first compound semiconductor layer 21, and the first electrode 31 is formed on the convex portion of the first surface 21a of the first compound semiconductor layer 21.

Figure 7A:
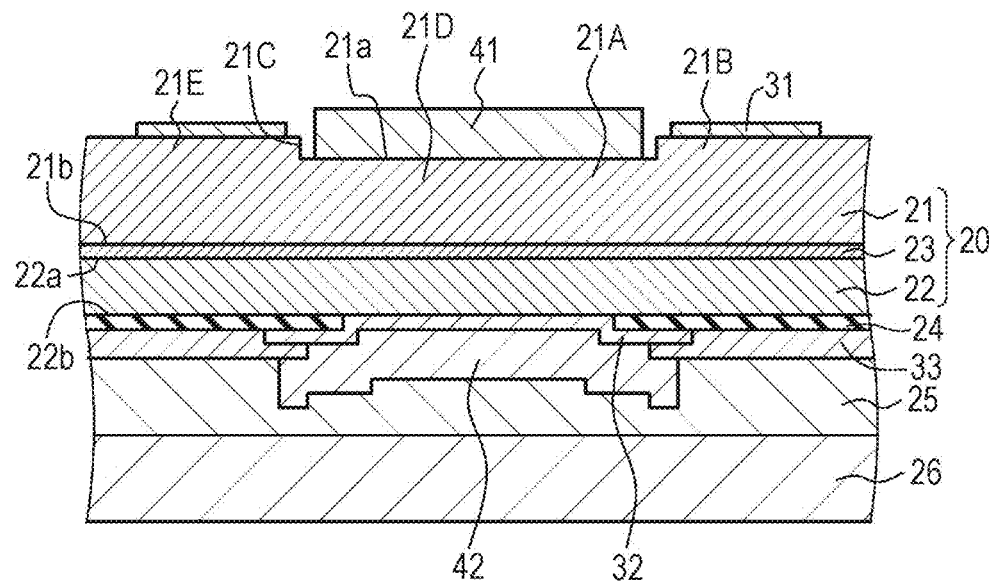
FIGS. 7A and 7B are respectively partial end views schematically illustrating a light emitting element of Example 2 and a modification example thereof.
Figure 7B:
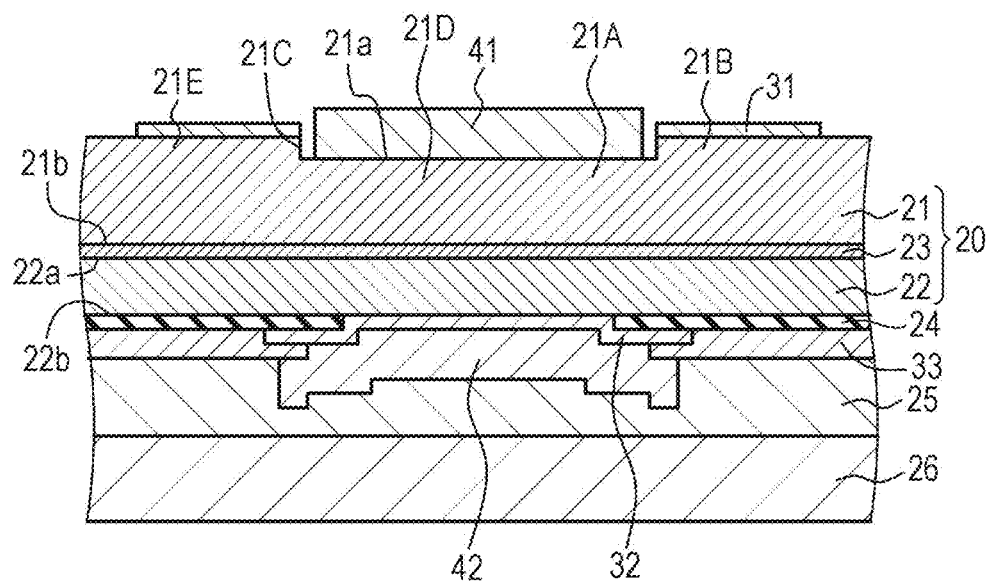
Figure 8A:
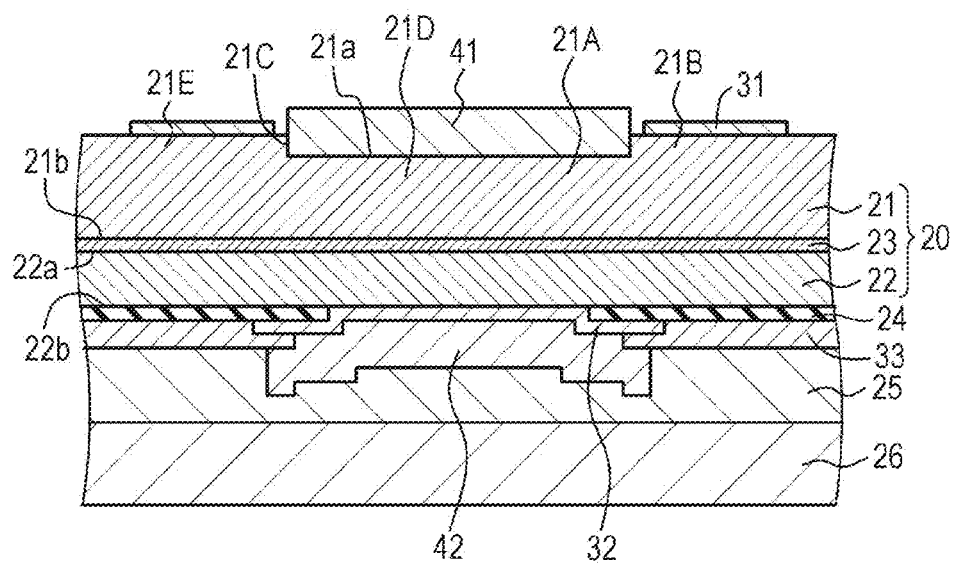
FIGS. 8A and 8B are respectively partial end views schematically illustrating the modification example of the light emitting element of Example 2.
Figure 8B:
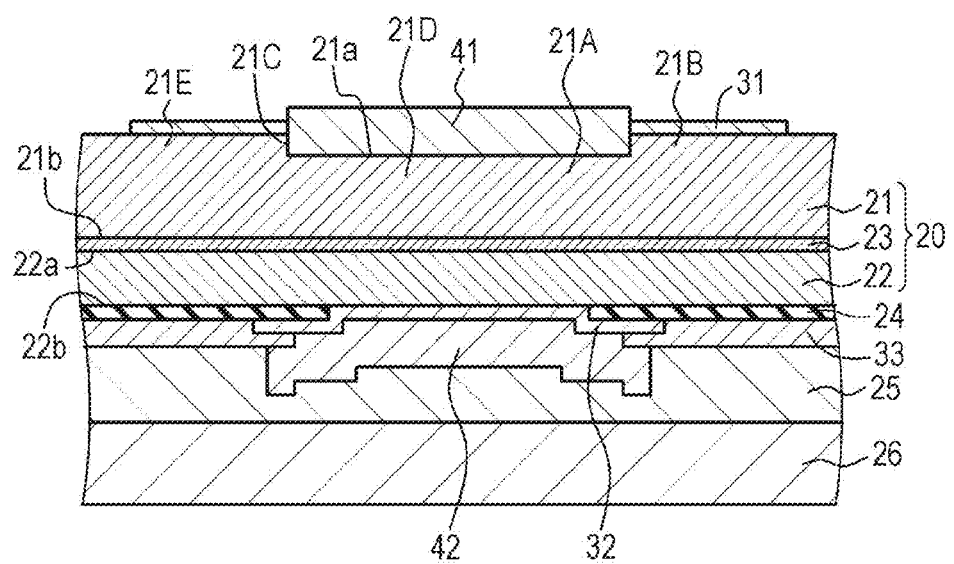
Figure 9A:
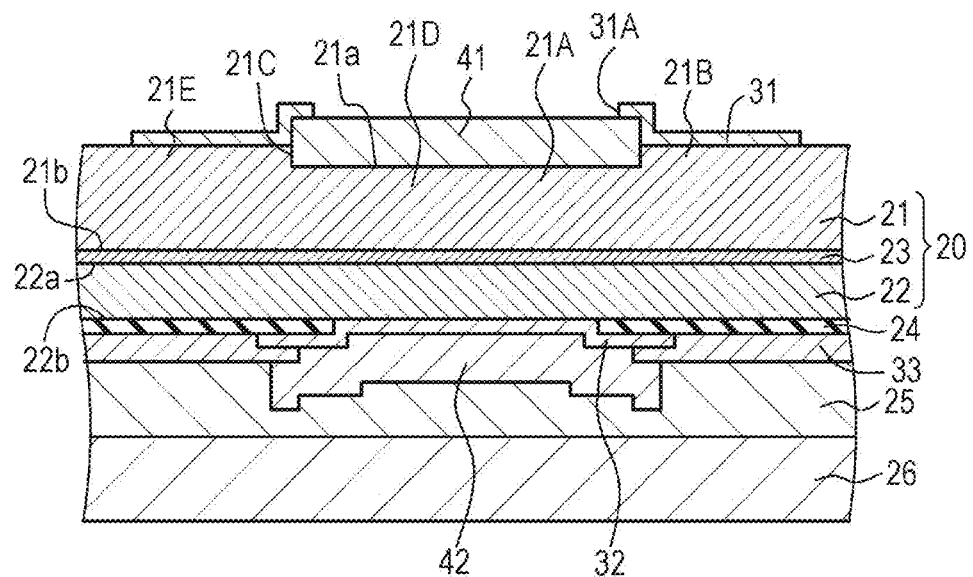
FIGS. 9A and 9B are respectively partial end views schematically illustrating the modification example of the light emitting element of Example 2.
Figure 9B:
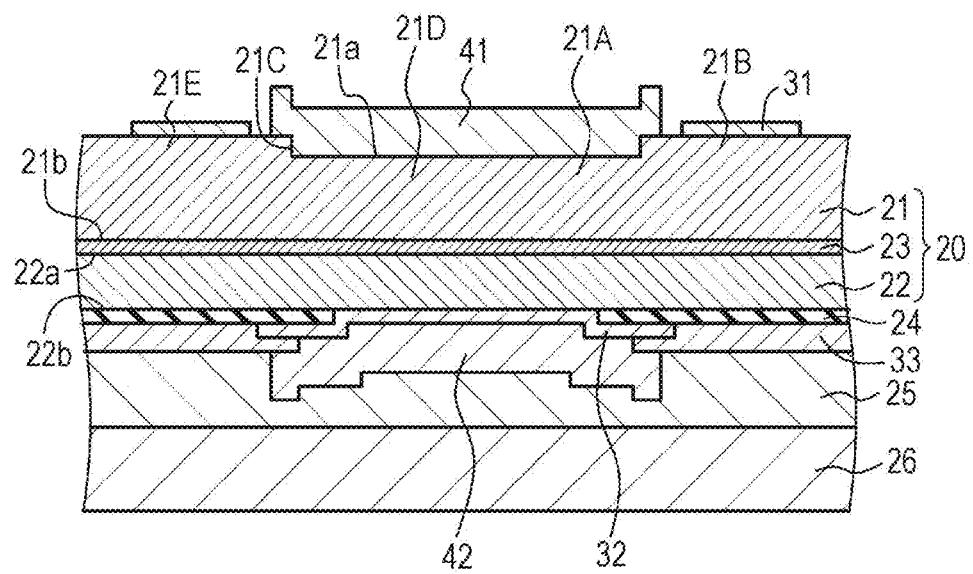
Figure 10A:
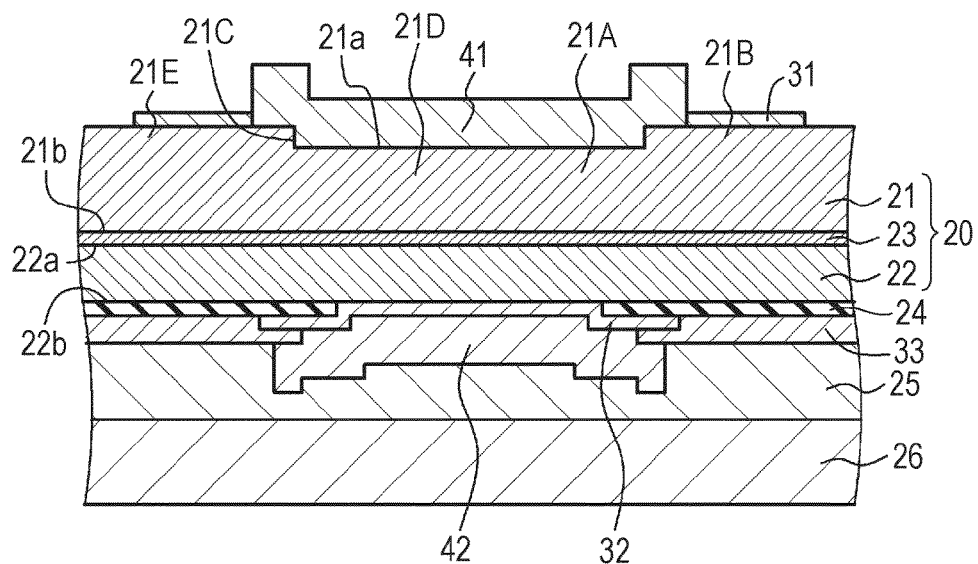
FIGS. 10A and 10B are respectively partial end views schematically illustrating the modification example of the light emitting element of Example 2.
Figure 10B:
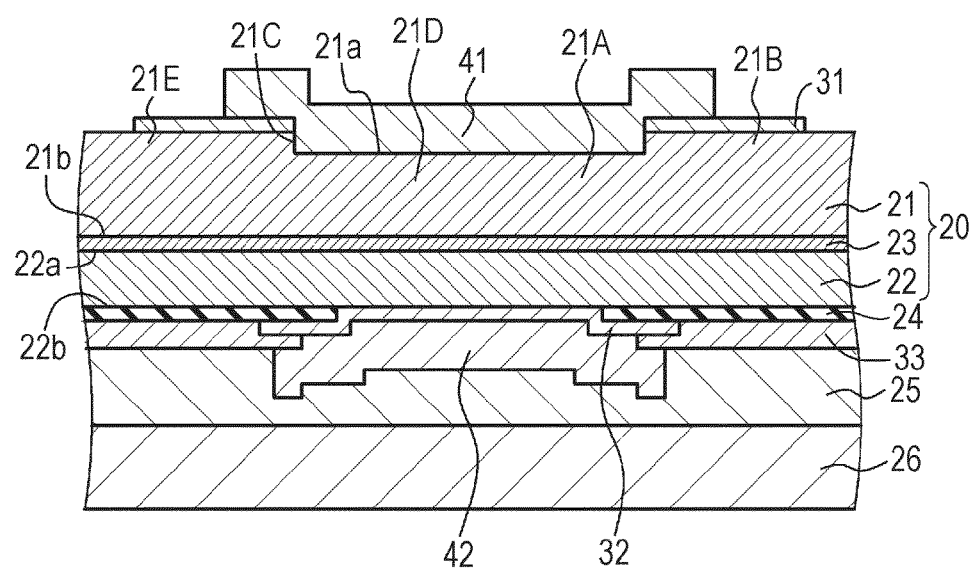
Figure 11A:
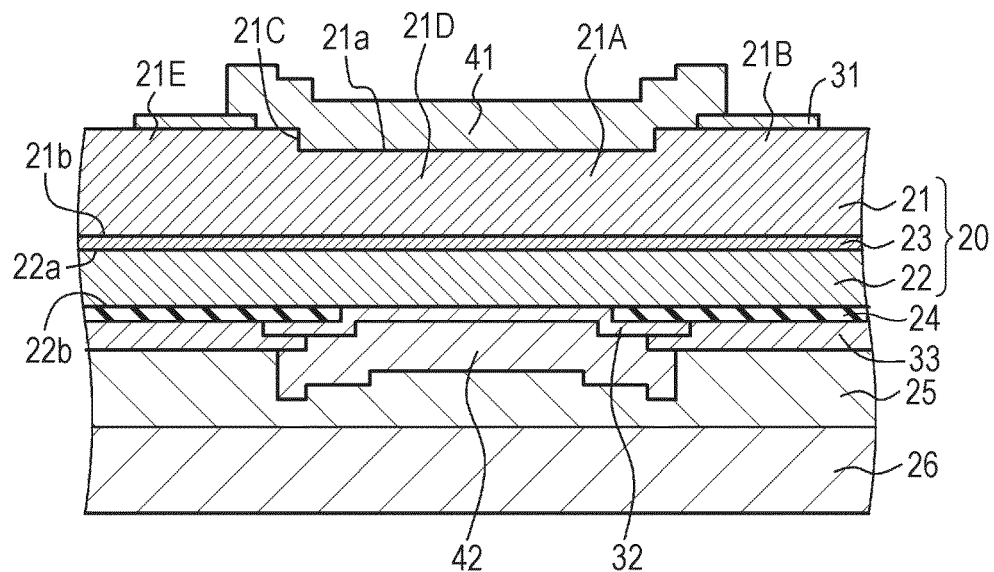
FIGS. 11A and 11B are respectively partial end views schematically illustrating the modification example of the light emitting element of Example 2.
Figure 11B:
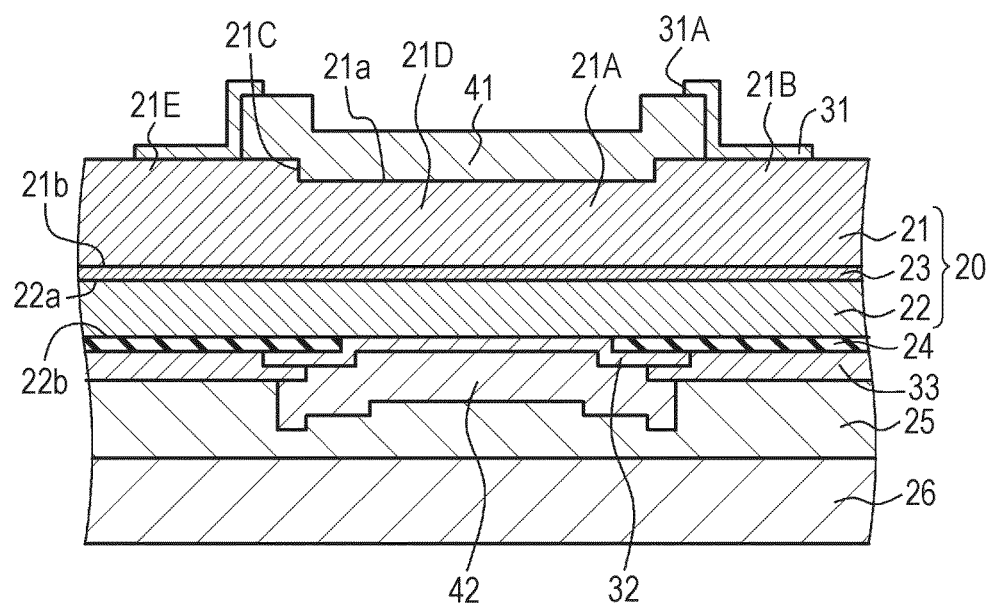
Figure 12A:
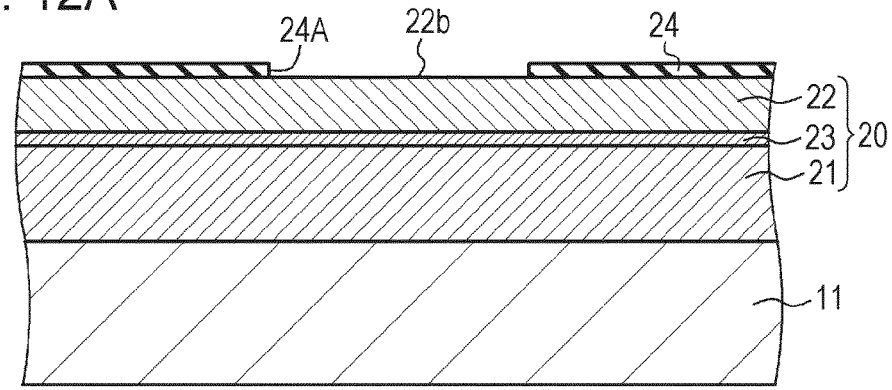
FIGS. 12A, 12B, and 12C are partial end views schematically illustrating a laminated structure or the like for describing a method of producing the light emitting element of Example 1.
Figure 12B:
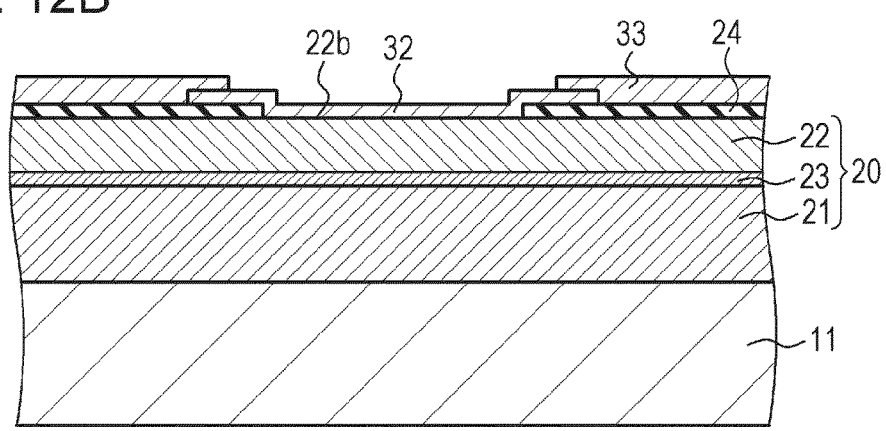
Figure 12C:
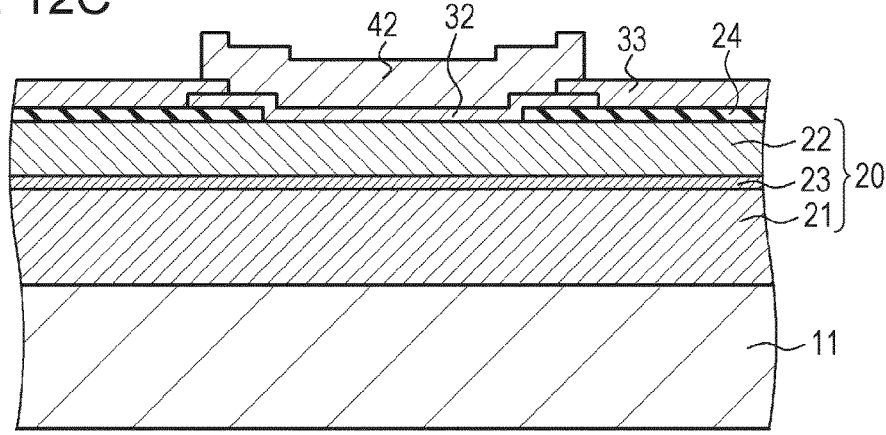
Figure 13A:
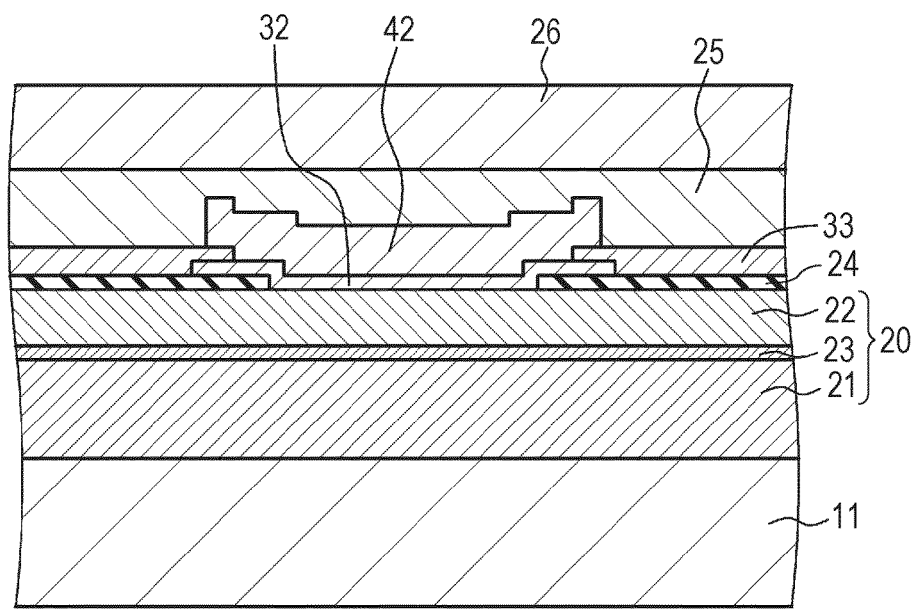
FIGS. 13A and 13B, continuously to FIG. 12C, are partial end views schematically illustrating the laminated structure or the like for describing the method of producing the light emitting element of Example 1.
Figure 13B:
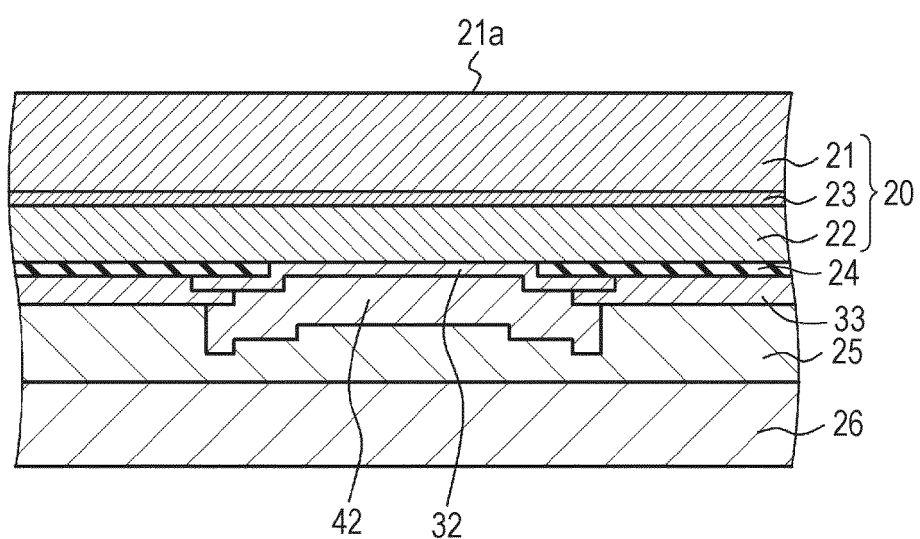
Figure 14:
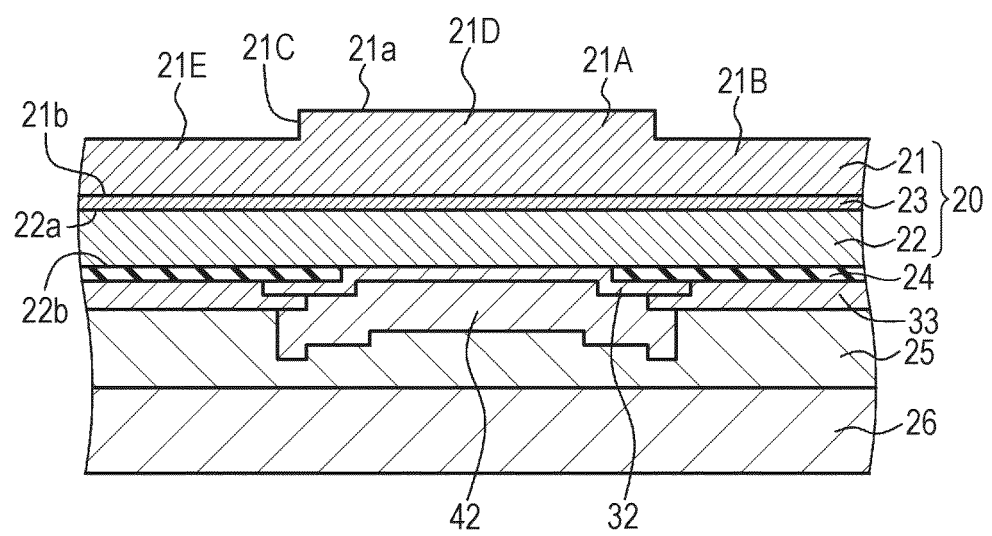
FIG. 14, continuously to FIG. 13B, is a partial end view schematically illustrating the laminated structure or the like for describing the method of producing the light emitting element of Example 1.

In the examples of the light emitting element shown in FIGS. 7A and 7B, the first light reflection layer 41 includes the flat area 21A or a part of the inside 21D of the step portion 21C and the end portion of the first electrode 31 is separated from the step portion 21C (see FIG. 7A), or the end portion of the first electrode 31 extends to the step portion 21C (see FIG. 7B). In the examples of the light emitting element shown in FIGS. 8A, 8B, and 9A, the first light reflection layer 41 includes the flat area 21A or all the inside 21D of the step portion 21C and the end portion of the first electrode 31 is separated from the step portion 21C (see FIG. 8A). Alternatively, the end portion of the first electrode 31 extends to the step portion 21C and the end portion of the first electrode 31 is in contact with the first light reflection layer 41 (see FIG. 8B). Alternatively, the end portion of the first electrode 31 extends to the edge portion of the first light reflection layer 41 (see FIG. 9A).

In the examples of the light emitting element shown in FIGS. 9B, 10A, 10B, 11A, and 11B, the first light reflection layer 41 includes the flat area 21A or all the inside 21D of the step portion 21C, and extends to the rough surface area 21B or the outside 21E of the step portion 21C. In addition, the first electrode 31 is formed by being separated from the first light reflection layer 41 (see FIG. 9B). Alternatively, the first electrode 31 is in contact with the first light reflection layer 41 (see FIG. 10A). Alternatively, the first light reflection layer 41 extends to the first electrode 31, and the end portion of the first electrode 31 extends to the step portion 21C (see FIG. 10B). Alternatively, the first light reflection layer 41 extends to the first electrode 31 and the end portion of the first electrode 31 is separated from the step portion 21C (see FIG. 11A). Alternatively, the first electrode 31 extends to the edge portion of the first light reflection layer 41 (see FIG. 11B).

Hereinbefore, the present disclosure has been described with reference to the preferred examples, but the present disclosure is not limited thereto. The configurations and the structures of the light emitting element described in the examples are merely examples and can be appropriately modified, and the method of producing the light emitting element of the examples can be appropriately modified. By appropriately selecting a bonding layer and a support substrate, a surface light emitting laser element emitting light through the second light reflection layer from the top surface of the second compound semiconductor layer can be used as the light emitting element depending on the situation. Alternatively, in the process-140, the light emitting laser element emitting light through the second light reflection layer from the top surface of the second compound semiconductor layer can be completed by forming the first light reflection layer and the first electrode and eliminating the support substrate. Alternatively, after the process-140, the light emitting laser element emitting light through the second light reflection layer from the top surface of the second compound semiconductor layer can be completed by fixing the first light reflection layer to the second support substrate, eliminating the support substrate, and exposing the second light reflection layer.

In addition, the present disclosure may have the following configurations.

[1] A light emitting element, including: a laminated structure, the laminated structure including a first compound semiconductor layer that includes a first surface and a second surface facing the first surface, an active layer that is in contact with the second surface of the first compound semiconductor layer, and a second compound semiconductor layer; where the first surface of the first compound semiconductor layer has a first surface area and a second surface area, the first and second surface areas being different in at least one of a height or a roughness, a first light reflection layer is formed on at least a portion of the first surface area, and a first electrode is formed on at least a portion of the second surface area.

[2] The light emitting element according to [1], where the first and second surface areas are different in roughness, the second surface area is rougher than the first surface area, there are at least two second surface areas and the first surface area is between the at least two second surface areas.

[3] The light emitting element according to [1], where the laminated structure is formed of a GaN based compound semiconductor.

[4] The light emitting element according to [1], where when a contact resistance value in the first surface area is set as $R_1$ and a contact resistance value in the second surface area is set as $R_2$, a relationship of $R_2/R_1 \leq 1$ is satisfied.

[5] The light emitting element according to [1], where the first and second surface areas are different in height, and the difference in height forms a step portion having a convex portion and a concave portion.

[6] The light emitting element according to [5], where the step portion is formed of a curved surface.

[7] The light emitting element according to [5], where the first light reflection layer is formed on at least a portion of the convex portion, and the first electrode is formed on at least a portion of the concave portion.

[8] The light emitting element according to [5], where the first light reflection layer is formed on at least a portion of the concave portion, and the first electrode is formed on at least a portion of the convex portion.

[9] The light emitting element according to [5], where the height of the step portion is less than the thickness of the first compound semiconductor layer.

[10] The light emitting element according to [5], where the first light reflection layer is formed across a boundary between the first surface area and the second surface area.

[11] The light emitting element according to [5], where a value of the surface roughness Ra on an inside of the step portion is approximately $3 \times 10^{-9}$ m or less, and a value of the surface roughness Ra on an outside of the step portion exceeds the value of the surface roughness Ra of the first surface of the first compound semiconductor layer on the inside of the step portion.

[12] The light emitting element according to [5], where when a contact resistance value on an inside of the step portion is set as $R_1$ and a contact resistance value on an outside of the step portion is set as $R_2$, a relationship of $R_2/R_1 \leq 1$ is satisfied.

[13] The light emitting element according to [1], where the first light reflection layer is in contact with the first electrode.

[14] The light emitting element according to [1], where the first light reflection layer is in contact with an entirety of the first surface area.

[15] The light emitting element according to [1], where the second compound semiconductor layer has a first surface and a second surface, the active layer is in contact with the first surface of the second compound semiconductor layer, the first light reflection layer is formed on the first surface of the first compound semiconductor layer, a second light reflection layer is formed on the second surface of the second compound semiconductor layer, and a distance from the first light reflection layer to the second light reflection layer is in a range of approximately 0.15 μm to approximately 50 μm.

[16] The light emitting element according to [1], where the second compound semiconductor layer includes a first surface and a second surface, the active layer is in contact with the first surface of the second compound semiconductor layer, a second light reflection layer is formed on the second surface of the second compound semiconductor layer, and the second light reflection layer is fixed to a support substrate.

[17] The light emitting element according to [1], where a value of a surface roughness Ra of the first surface area is approximately $3 \times 10^{-9}$ m or less, and a value of a surface roughness Ra of the second surface area exceeds the value of the surface roughness Ra of the first surface area.

[18] The light emitting element according to [16], where when an area of a portion of the first light reflection layer is set as $S_1$, and an area of a portion of the second light reflection layer is set as $S_2$, a relationship of $S_1 > S_2$ is satisfied.

[19] A method of producing a light emitting element, including: forming a laminated structure, the laminated structure including a first compound semiconductor layer that includes a first surface and a second surface facing the first surface, an active layer that is in contact with the second surface of the first compound semiconductor layer, and a second compound semiconductor layer; and forming a second surface area on the first surface of the first compound semiconductor layer, forming a first light reflection layer on at least a portion of a first surface area that is a portion of the first surface of the first compound semiconductor layer, the first and second surface areas being different in at least one of a height or a roughness, and forming a first electrode on at least a portion of the second surface area.

[20] The light emitting element according to [5], where the first electrode is formed across a boundary between the first surface area and the second surface area.

[A01] Light Emitting Element

First Embodiment

A light emitting element including: (A) a laminated structure on which a first compound semiconductor layer that is formed of a GaN-based compound semiconductor and includes a first surface and a second surface facing the first surface, an active layer that is formed of the GaN-based compound semiconductor and is in contact with the second surface of the first compound semiconductor layer, and a second compound semiconductor layer that is formed of the GaN-based compound semiconductor, includes a first surface and a second surface facing the first surface, and whose first surface is in contact with the active layer are laminated; (B) a first light reflection layer that is formed of a first electrode formed on the first surface of the first compound semiconductor layer and a multilayer film formed on the first surface of the first compound semiconductor layer; and (C) a second light reflection layer that is formed of a second electrode and a multilayer film formed on the second surface of the second compound semiconductor layer, in which the first surface of the first compound semiconductor layer has a flat area and a rough surface area which is rougher than the flat area, the first light reflection layer is formed on at least the flat area, and the first electrode is formed on at least the rough surface area.

[A02] The light emitting element according to [A01], in which the rough surface area surrounds the flat area.

[A03] The light emitting element according to [A01] or [A02], in which a value of a surface roughness Ra of the flat area is $3 \times 10^{-9}$ m or less, and a value of a surface roughness Ra of the rough area exceeds the value of the surface roughness Ra of the flat area.

[A04] The light emitting element according to any one of [A01] to [A03], in which when a contact resistance value in the flat area is set as $R_1$ and a contact resistance value in the rough area is set as $R_2$, a relationship of $R_2/R_1 \leq 1$ is satisfied.

[A05] The light emitting element according to any one of [A01] to [A04], in which the first light reflection layer is in contact with the first electrode.

[A06] The light emitting element according to any one of [A01] to [A04], in which the first light reflection layer is separated from the first electrode and the separation distance is within 1 mm.

[A07] The light emitting element according to any one of [A01] to [A06], in which the distance between the first light reflection layer and the second light reflection layer is in the range of 0.15 μm to 50 μm.

[A08] The light emitting element according to any one of [A01] to [A07], in which the second light reflection layer is fixed to the support substrate.

[A09] The light emitting element according to any one of [A01] to [A08], in which the light generated from the active layer is emitted to the outside through the first light reflection layer.

[A10] The light emitting element according to [A09], in which when an area of a portion of the first light reflection layer in contact with the first surface of the first compound semiconductor layer is set as $S_1$ and an area of a portion of the second light reflection layer facing the second surface of the second compound semiconductor layer is set as $S_2$, a relationship of $S_1 > S_2$ is satisfied.

[A11] The light emitting element according to any one of [A01] to [A10], in which the first electrode is formed of a metal or an alloy.

[A12] The light emitting element according to any one of [A01] to [A11], in which the second electrode is formed of a transparent conductive material.

[A13] The light emitting element according to any one of [A01] to [A12], in which the light emitting element is formed of a surface light emitting laser element.

[B01] Light Emitting Element

Second Embodiment

A light emitting element including: (A) a laminated structure on which a first compound semiconductor layer that is formed of a GaN-based compound semiconductor and includes a first surface and a second surface facing the first surface, an active layer that is formed of the GaN-based compound semiconductor and is in contact with the second surface of the first compound semiconductor layer, and a second compound semiconductor layer that is formed of the GaN-based compound semiconductor, includes a first surface and a second surface facing the first surface, and whose first surface is in contact with the active layer are laminated; (B) a first light reflection layer that is formed of a first electrode formed on the first surface of the first compound semiconductor layer and a multilayer film formed on the first surface of the first compound semiconductor layer; and (C) a second light reflection layer that is formed of a second electrode and a multilayer film formed on the second surface of the second compound semiconductor layer, in which a step portion is formed on the first surface of the first compound semiconductor layer, the first light reflection layer is formed on at least the inside of the step portion, and the first electrode is formed on at least the outside of the step portion.

[B02] The light emitting element according to [B01], in which the step portion is formed of a simple closed curve.

[B03] The light emitting element according to [B01] or [B02], in which the first light reflection layer is formed on a convex portion of the first surface of the first compound semiconductor layer, and the first electrode is formed on a concave portion of the first surface of the first compound semiconductor layer.

[B04] The light emitting element according to [B01] or [B02], in which the first light reflection layer is formed on the concave portion of the first surface of the first compound semiconductor layer, and the first electrode is formed on the convex portion of the first surface of the first compound semiconductor layer.

[B05] The light emitting element according to any one of [B01] to [B04], in which the height of the step portion is less than the thickness of the first compound semiconductor layer.

[B06] The light emitting element according to any one of [B01] to [B04], in which the height of the step portion is in the range of $1\times10^{-8}$ m to $1\times10^{-5}$ m.
[B07] The light emitting element according to any one of [B01] to [B06], in which the value of the surface roughness Ra of the first surface of the first semiconductor layer on the inside of the step portion is $3\times10^{-9}$ m or less, and the value of the surface roughness Ra of the first surface of the first compound semiconductor layer on the outside of the step portion exceeds the value of the surface roughness Ra of the first surface of the first compound semiconductor layer on the inside of the step portion.
[B08] The light emitting element according to any one of [B01] to [B07], in which when a contact resistance value in the first surface of the first compound semiconductor layer on the inside of the step portion is set as $R_1$ and a contact resistance value of the first surface of the first compound semiconductor layer on the outside of the step portion is set as $R_2$, a relationship of $R_2/R_1 \leq 1$ is satisfied.
[B09] The light emitting element according to any one of [B01] to [B08], in which the first light reflection layer is in contact with the first electrode.
[B10] The light emitting element according to any one of [B01] to [B08], in which the first light reflection layer is separated from the first electrode and the separation distance is within 1 mm.
[B11] The light emitting element according to any one of [B01] to [B10], in which the distance between the first light reflection layer and the second light reflection layer is in the range of 0.15 μm to 50 μm.
[B12] The light emitting element according to any one of [B01] to [B11], in which the second light reflection layer is fixed to the support substrate.
[B13] The light emitting element according to any one of [B01] to [B12], in which the light generated from the active layer is emitted to the outside through the first light reflection layer.
[B14] The light emitting element according to [B13], in which when an area of a portion of the first light reflection layer in contact with the first surface of the first compound semiconductor layer is set as $S_1$ and an area of a portion of the second light reflection layer facing the second surface of the second compound semiconductor layer is set as $S_2$, a relationship of $S_1 > S_2$ is satisfied.
[B15] The light emitting element according to any one of [B01] to [B14], in which the first electrode is formed of a metal or an alloy.
[B16] The light emitting element according to any one of [B01] to [B15], in which the second electrode is formed of a transparent conductive material.
[B17] The light emitting element according to any one of [B01] to [B16], in which the light emitting element is formed of a surface light emitting laser element.
[C01] Method of Producing Light Emitting Element First Embodiment A method of producing a light emitting element including: (a) forming a laminated structure on which a first compound semiconductor layer that is formed of a GaN-based compound semiconductor and includes a first surface and a second surface facing the first surface, an active layer that is formed of the GaN-based compound semiconductor and is in contact with the second surface of the first compound semiconductor layer, and a second compound semiconductor layer that is formed of the GaN-based compound semiconductor, includes a first surface and a second surface facing the first surface, and whose first surface is in contact with the active layer are laminated on a substrate for producing a light emitting element; (b) forming a second light reflection layer that is formed of a second electrode and a multilayer film on the second surface of the second compound semiconductor layer; (c) fixing the second light reflection layer to a support substrate; (d) eliminating the substrate for producing the light emitting element and exposing the first surface of the first compound semiconductor layer; and (e) forming a rough surface area on the first surface of the first compound semiconductor layer, forming the first light reflection layer that is formed of a multilayer film on at least a flat area which is a portion of the first surface of the first compound semiconductor layer surrounded by the rough surface area, and forming a first electrode on at least the rough surface area.
[C02] The method of producing a light emitting element according to [C01], the first surface of the first compound semiconductor layer in the process (d) is exposed based on a chemical/mechanical polishing method, and a rough surface area in the process (e) is formed based on a reactive ion etching method.
[C03] The method of producing a light emitting element according to [C01] or [C02], in which the value of the surface roughness Ra of the flat area is $3\times10^{-9}$ m or less, and the value of the surface roughness Ra of the rough surface area exceeds the value of the surface roughness Ra of the flat area.
[C04] The method of producing a light emitting element according to any one of [C01] to [C03], in which when the contact resistance value in the flat area is set as $R_1$ and the contact resistance value in the rough surface area is set as $R_2$, a relationship of $R_2/R_1 \leq 1$ is satisfied.
[C05] The method of producing a light emitting element according to any one of [C01] to [C04], in which the first light reflection layer is in contact with the first electrode.
[C06] The method of producing a light emitting element according to any one of [C01] to [C04], in which the first light reflection layer is separated from the first electrode and the separation distance is within 1 mm.
[C07] The method of producing a light emitting element according to any one of [C01] to [C06], in which the distance between the first light reflection layer and the second light reflection layer is in the range of 0.15 μm to 50 μm.
[C08] The method of producing a light emitting element according to any one of [C01] to [C07], in which the light generated from the active layer is emitted to the outside through the first light reflection layer.
[C09] The method of producing a light emitting element according to [C08], in which when an area of a portion of the first light reflection layer in contact with the first surface of the first compound semiconductor layer is set as $S_1$ and an area of a portion of the second light reflection layer facing the second surface of the second compound semiconductor layer is set as $S_2$, a relationship of $S_1 > S_2$ is satisfied.
[C10] The method of producing a light emitting element according to any one of [C01] to [C09], in which the first electrode is formed of a metal or an alloy.
[C11] The method of producing a light emitting element according to any one of [C01] to [C10], in which the second electrode is formed of a transparent conductive material.
[C12] The method of producing a light emitting element according to any one of [C01] to [C11], in which the light emitting element is formed of a surface light emitting laser element.

[D01] Method of Producing Light Emitting Element

Second Embodiment

A method of producing a light emitting element including: (a) forming a laminated structure on which a first compound semiconductor layer that is formed of a GaN-based compound semiconductor and includes a first surface and a second surface facing the first surface, an active layer that is formed of the GaN-based compound semiconductor and is in contact with the second surface of the first compound semiconductor layer, and a second compound semiconductor layer that is formed of the GaN-based compound semiconductor, includes a first surface and a second surface facing the first surface, and whose first surface is in contact with the active layer are laminated on a substrate for producing a light emitting element; (b) forming a second light reflection layer that is formed of a second electrode and a multilayer film on the second surface of the second compound semiconductor layer; (c) fixing the second light reflection layer to a support substrate; (d) eliminating the substrate for producing the light emitting element and exposing the first surface of the first compound semiconductor layer; and (e) forming a step portion on the first surface of the first compound semiconductor layer, forming a first light reflection layer formed of a multilayer film on at least the inside of the step portion, and forming a first electrode on at least the outside of the step portion.

[D02] The method of producing a light emitting element according to [D01], in which the first surface of the first compound semiconductor layer in the process (d) is exposed based on a chemical/mechanical polishing method, and a step portion in the process (e) is formed based on a reactive ion etching method.

[D03] The method of producing a light emitting element according to [D01] or [D02], in which the step portion is formed of a simple closed curve.

[D04] The method of producing a light emitting element according to any one of [D01] to [D03], in which the first light reflection layer is formed on a convex portion of the first surface of the first compound semiconductor layer, and the first electrode is formed on a concave portion of the first surface of the first compound semiconductor layer.

[D05] The method of producing a light emitting element according to any one of [D01] to [D03], in which the first light reflection layer is formed on the concave portion of the first surface of the first compound semiconductor layer, and the first electrode is formed on the concave portion of the first surface of the first compound semiconductor layer.

[D06] The method of producing a light emitting element according to any one of [D01] to [D05], in which the height of the step portion is less than the thickness of the first compound semiconductor layer.

[D07] The method of producing a light emitting element according to any one of [D01] to [D06], in which the height of the step portion is in the range of $1 \times 10^{-8}$ m to $1 \times 10^{-5}$ m.

[D08] The method of producing a light emitting element according to any one of [D01] to [D07], in which the value of the surface roughness Ra of the first surface of the first semiconductor layer on the inside of the step portion is $3 \times 10^{-9}$ m or less, and the value of the surface roughness Ra of the first surface of the first compound semiconductor layer on the outside of the step portion exceeds the value of the surface roughness Ra of the first surface of the first compound semiconductor layer on the inside of the step portion.

[D09] The method of producing a light emitting element according to any one of [D01] to [D08], in which when a contact resistance value in the first surface of the first compound semiconductor layer on the inside of the step portion is set as $R_1$ and a contact resistance value of the first surface of the first compound semiconductor layer on the outside of the step portion is set as $R_2$, a relationship of $R_2/R_1 \leq 1$ is satisfied.

[D10] The method of producing a light emitting element according to any one of [D01] to [D09], in which the first light reflection layer is in contact with the first electrode.

[D11] The method of producing a light emitting element according to any one of [D01] to [D09], in which the first light reflection layer is separated from the first electrode and the separation distance is within 1 mm.

[D12] The method of producing a light emitting element according to any one of [D01] to [D11], in which the distance between the first light reflection layer and the second light reflection layer is in the range of 0.15 μm to 50 μm.

[D13] The method of producing a light emitting element according to any one of [D01] to [D12], in which the light generated from the active layer is emitted to the outside through the first light reflection layer.

[D14] The method of producing a light emitting element according to [D13], in which when an area of a portion of the first light reflection layer in contact with the first surface of the first compound semiconductor layer is set as $S_1$ and an area of a portion of the second light reflection layer facing the second surface of the second compound semiconductor layer is set as $S_2$, a relationship of $S_1 > S_2$ is satisfied.

[D15] The method of producing a light emitting element according to any one of [D01] to [D14], in which the first electrode is formed of a metal or an alloy.

[D16] The method of producing a light emitting element according to any one of [D01] to [D15], in which the second electrode is formed of a transparent conductive material.

[D17] The method of producing a light emitting element according to any one of [D01] to [D16], in which the light emitting element is formed of a surface light emitting laser element.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting element, comprising:
   a laminated structure, the laminated structure including a first compound semiconductor layer that includes a first surface and a second surface facing the first surface, a second compound semiconductor layer that includes a first surface and a second surface facing the first surface, and an active layer that is in contact with the second surface of the first compound semiconductor layer;
   wherein the first surface of the first compound semiconductor layer has a first surface area and a second surface area, the first and second surface areas being different in a height,
   a first light reflection layer is formed on at least a portion of the first surface area, and
   a first electrode is formed on at least a portion of the second surface area,
   wherein the second surface of the second compound semiconductor layer is in contact with a second electrode, wherein the first light reflection layer is above the second electrode in a depth direction of the laminated structure, and wherein the second electrode is in contact with a second light reflection layer.

2. The light emitting element according to claim 1, wherein the laminated structure is formed of a GaN based compound semiconductor.

3. The light emitting element according to claim 1, wherein when a contact resistance value in the first surface area is set as $R_1$ and a contact resistance value in the second surface area is set as $R_2$, a relationship of $R_2/R_1 \leq 1$ is satisfied.

4. The light emitting element according to claim 1, wherein the difference in height forms a step portion having a convex portion and a concave portion.

5. The light emitting element according to claim 4, wherein the step portion is formed of a curved surface.

6. The light emitting element according to claim 4, wherein the first light reflection layer is formed on at least a portion of the convex portion, and the first electrode is formed on at least a portion of the concave portion.

7. The light emitting element according to claim 4, wherein the first light reflection layer is formed on at least a portion of the concave portion, and the first electrode is formed on at least a portion of the convex portion.

8. The light emitting element according to claim 4, wherein the first compound semiconductor layer is a single layer of GaN and the single layer includes the step portion and the height of the step portion is less than a remaining thickness of the first compound semiconductor layer.

9. The light emitting element according to claim 4, wherein the first light reflection layer is formed across a boundary between the first surface area and the second surface area.

10. The light emitting element according to claim 4, wherein when a contact resistance value on an inside of the step portion is set as $R_1$ and a contact resistance value on an outside of the step portion is set as $R_2$, a relationship of $R_2/R_1 \leq 1$ is satisfied.

11. The light emitting element according to claim 4, wherein the first electrode is formed across a boundary between the first surface area and the second surface area.

12. The light emitting element according to claim 1, wherein the first light reflection layer is in contact with the first electrode.

13. The light emitting element according to claim 1, wherein the first light reflection layer is in contact with an entirety of the first surface area, and wherein the active layer is positioned between the first electrode and the second electrode in a depth direction.

14. The light emitting element according to claim 1, wherein the active layer is in contact with the first surface of the second compound semiconductor layer, the first light reflection layer is formed on the first surface of the first compound semiconductor layer, the second light reflection layer is formed on the second surface of the second compound semiconductor layer, and a distance from the first light reflection layer to the second light reflection layer is in a range of approximately 0.15 µm to approximately 50 µm.

15. The light emitting element according to claim 1, wherein the active layer is in contact with the first surface of the second compound semiconductor layer, the second light reflection layer is formed on the second surface of the second compound semiconductor layer, and the second light reflection layer is fixed to a support substrate.

16. The light emitting element according to claim 15, wherein when an area of a portion of the first light reflection layer is set as $S_1$, and an area of a portion of the second light reflection layer is set as $S_2$, a relationship of $S_1 > S_2$ is satisfied.

17. A method of producing a light emitting element, comprising:
  forming a laminated structure, the laminated structure including a first compound semiconductor layer that includes a first surface and a second surface facing the first surface, a second compound semiconductor layer that includes a first surface and a second surface facing the first surface, and an active layer that is in contact with the second surface of the first compound semiconductor layer; and
  forming a second surface area on the first surface of the first compound semiconductor layer, forming a first light reflection layer on at least a portion of a first surface area that is a portion of the first surface of the first compound semiconductor layer, the first and second surface areas being different in a height, and forming a first electrode on at least a portion of the second surface area,
  wherein the second surface of the second compound semiconductor layer is in contact with a second electrode, wherein the first light reflection layer is above the second electrode in a depth direction of the laminated structure, and wherein the second electrode is in contact with a second light reflection layer.

* * * * *